US010510703B2

(12) United States Patent
Chi et al.

(10) Patent No.: US 10,510,703 B2
(45) Date of Patent: Dec. 17, 2019

(54) SEMICONDUCTOR DEVICE AND METHOD OF FORMING 3D DUAL SIDE DIE EMBEDDED BUILD-UP SEMICONDUCTOR PACKAGE

(71) Applicant: STATS ChipPAC Pte. Ltd., Singapore (SG)

(72) Inventors: HeeJo Chi, Kyoungki-do (KR); HanGil Shin, Seoul (KR); NamJu Cho, Gyeonggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 91 days.

(21) Appl. No.: 15/594,443

(22) Filed: May 12, 2017

(65) Prior Publication Data

US 2017/0250154 A1    Aug. 31, 2017

Related U.S. Application Data

(60) Continuation of application No. 15/130,452, filed on Apr. 15, 2016, now Pat. No. 9,691,707, which is a
(Continued)

(51) Int. Cl.
*H01L 23/00* (2006.01)
*H01L 23/528* (2006.01)
(Continued)

(52) U.S. Cl.
CPC .......... *H01L 24/19* (2013.01); *H01L 21/486* (2013.01); *H01L 21/4853* (2013.01);
(Continued)

(58) Field of Classification Search
CPC ... H01L 24/19; H01L 21/4853; H01L 21/486; H01L 21/561; H01L 21/568; H01L 21/6835
(Continued)

(56) References Cited

U.S. PATENT DOCUMENTS 5,353,498 A * 10/1994 Fillion ................. H01L 21/568
257/E21.505
6,828,665 B2 * 12/2004 Pu ........................ H01L 23/3128
257/686
(Continued)

*Primary Examiner* — Dzung Tran
(74) *Attorney, Agent, or Firm* — Brian M. Kaufman; Robert D. Atkins; Patent Law Group: Atkins and Associates, P.C.

(57) ABSTRACT

A semiconductor device has a plurality of semiconductor die. A substrate is provided with bumps disposed over the substrate. A first prefabricated insulating film is disposed between the semiconductor die and substrate. An interconnect structure is formed over the semiconductor die and first prefabricated insulating film. The bumps include a copper core encapsulated within copper plating. The first prefabricated insulating film includes glass cloth, glass fiber, or glass fillers. The substrate includes a conductive layer formed in the substrate and coupled to the bumps. The semiconductor die is disposed between the bumps of the substrate. The bumps and the semiconductor die are embedded within the first prefabricated insulating film. A portion of the first prefabricated insulating film is removed to expose the bumps. The bumps electrically connect the substrate to the interconnect structure.

25 Claims, 16 Drawing Sheets

Related U.S. Application Data division of application No. 14/220,336, filed on Mar. 20, 2014, now Pat. No. 9,362,161.

(51) Int. Cl.

| | |
|---|---|
| *H01L 21/768* | (2006.01) |
| *H01L 23/498* | (2006.01) |
| *H01L 21/56* | (2006.01) |
| *H01L 21/48* | (2006.01) |
| *H01L 23/538* | (2006.01) |
| *H01L 21/683* | (2006.01) |

(52) U.S. Cl.
CPC .......... *H01L 21/561* (2013.01); *H01L 21/568* (2013.01); *H01L 21/6835* (2013.01); *H01L 21/768* (2013.01); *H01L 23/49816* (2013.01); *H01L 23/49827* (2013.01); *H01L 23/528* (2013.01); *H01L 23/5383* (2013.01); *H01L 23/5386* (2013.01); *H01L 23/5389* (2013.01); *H01L 24/08* (2013.01); *H01L 24/20* (2013.01); *H01L 24/24* (2013.01); *H01L 24/25* (2013.01); *H01L 24/73* (2013.01); *H01L 24/94* (2013.01); *H01L 24/96* (2013.01); *H01L 24/97* (2013.01); *H01L 24/11* (2013.01); *H01L 24/13* (2013.01); *H01L 2221/6834* (2013.01); *H01L 2221/68345* (2013.01); *H01L 2221/68359* (2013.01); *H01L 2221/68386* (2013.01); *H01L 2224/0401* (2013.01); *H01L 2224/04105* (2013.01); *H01L 2224/06181* (2013.01); *H01L 2224/08146* (2013.01); *H01L 2224/08235* (2013.01); *H01L 2224/1132* (2013.01); *H01L 2224/1134* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/11901* (2013.01); *H01L 2224/12105* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/19* (2013.01); *H01L 2224/24227* (2013.01); *H01L 2224/25171* (2013.01); *H01L 2224/82039* (2013.01); *H01L 2224/94* (2013.01); *H01L 2224/95001* (2013.01); *H01L 2224/97* (2013.01); *H01L 2924/1033* (2013.01); *H01L 2924/10252* (2013.01); *H01L 2924/10253* (2013.01); *H01L 2924/10272* (2013.01); *H01L 2924/10322* (2013.01); *H01L 2924/10324* (2013.01); *H01L 2924/10329* (2013.01); *H01L 2924/10335* (2013.01); *H01L 2924/12041* (2013.01); *H01L 2924/12042* (2013.01); *H01L 2924/13091* (2013.01); *H01L 2924/14* (2013.01); *H01L 2924/1433* (2013.01); *H01L 2924/1434* (2013.01); *H01L 2924/14335* (2013.01); *H01L 2924/153* (2013.01); *H01L 2924/181* (2013.01); *H01L 2924/19011* (2013.01); *H01L 2924/19041* (2013.01); *H01L 2924/19042* (2013.01); *H01L 2924/19043* (2013.01); *H01L 2924/19103* (2013.01); *H01L 2924/19104* (2013.01); *H01L 2924/19105* (2013.01)

(58) Field of Classification Search
USPC .......................................... 257/777; 438/107
See application file for complete search history.

(56) References Cited

U.S. PATENT DOCUMENTS

| | | | |
|---|---|---|---|
| 6,833,612 | B2 | 12/2004 | Akram et al. |
| 8,383,457 | B2 | 2/2013 | Pagaila et al. |
| 8,384,227 | B2 | 2/2013 | Cho et al. |
| 8,546,193 | B2 | 10/2013 | Do et al. |
| 2005/0121764 | A1 | 6/2005 | Mallik et al. |
| 2008/0036065 | A1 | 2/2008 | Brunnbauer et al. |
| 2009/0091022 | A1* | 4/2009 | Meyer .................. H01L 21/561 257/723 |
| 2009/0108425 | A1* | 4/2009 | Lee ...................... H01L 23/3128 257/679 |
| 2010/0072599 | A1 | 3/2010 | Camacho et al. |
| 2010/0133665 | A1* | 6/2010 | Ha ....................... H01L 21/4853 257/666 |
| 2010/0237495 | A1 | 9/2010 | Pagaila et al. |
| 2010/0244208 | A1 | 9/2010 | Pagaila et al. |
| 2010/0252921 | A1 | 10/2010 | Katagiri |
| 2011/0140247 | A1 | 6/2011 | Pagaila et al. |
| 2011/0147911 | A1 | 6/2011 | Kohl et al. |
| 2011/0156264 | A1 | 6/2011 | Machida |
| 2011/0186977 | A1* | 8/2011 | Chi ......................... H01L 21/78 257/686 |
| 2011/0193217 | A1 | 8/2011 | Meyer-Berg |
| 2011/0254159 | A1 | 10/2011 | Hwang et al. |
| 2012/0038044 | A1 | 2/2012 | Chang et al. |
| 2012/0056329 | A1* | 3/2012 | Pagaila .................. H01L 21/56 257/774 |
| 2014/0077362 | A1 | 3/2014 | Lin et al. |

\* cited by examiner

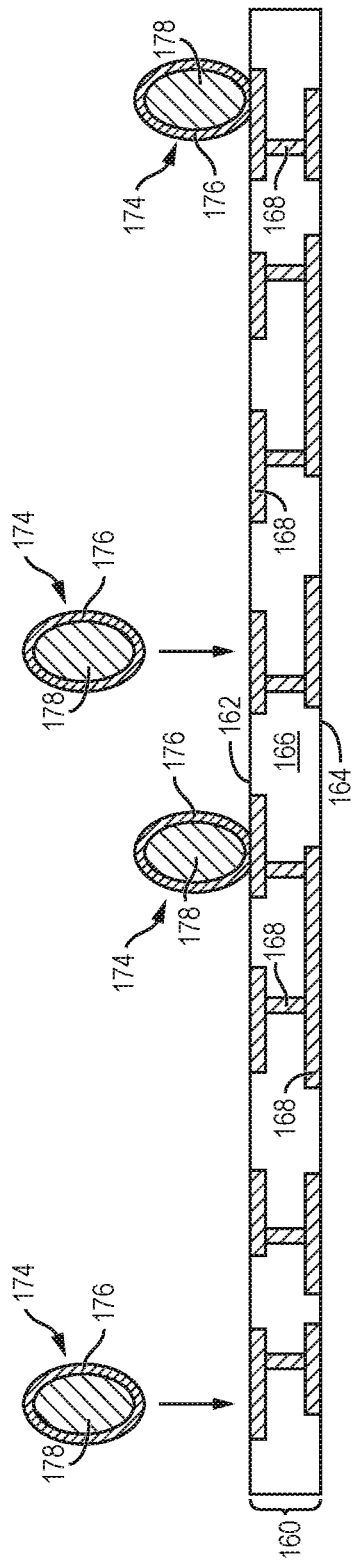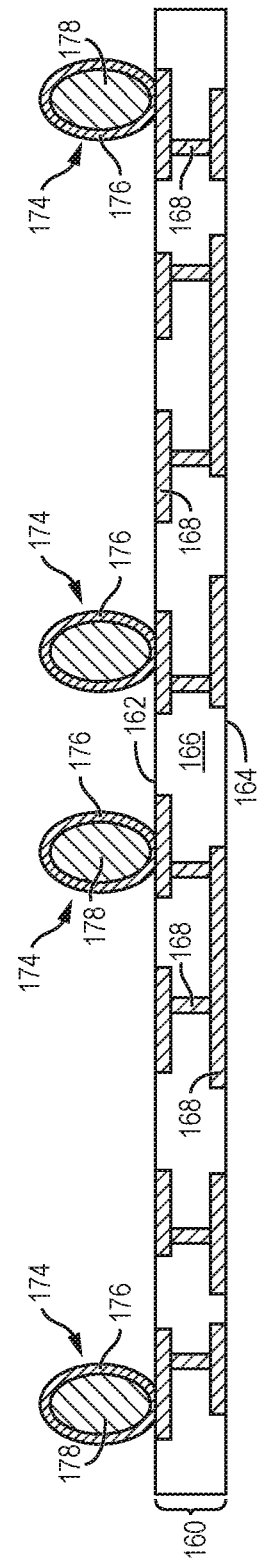

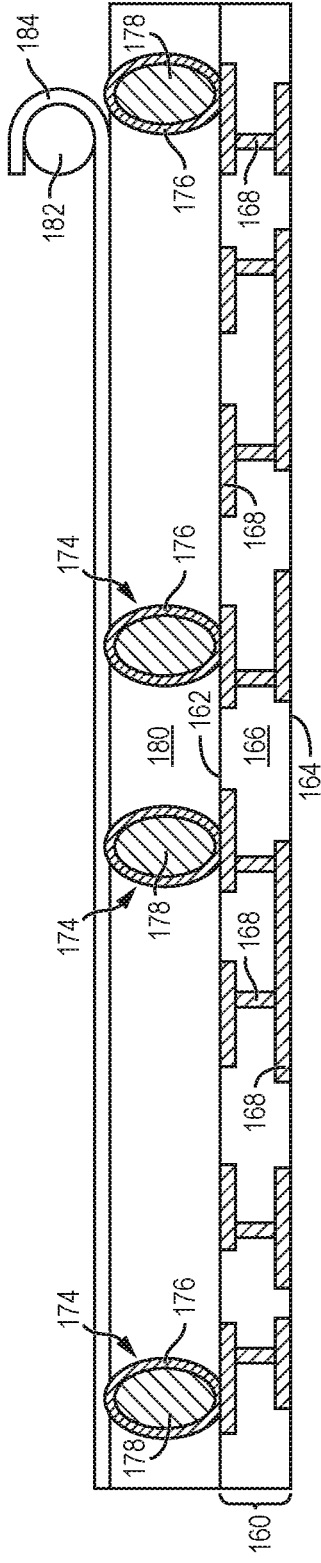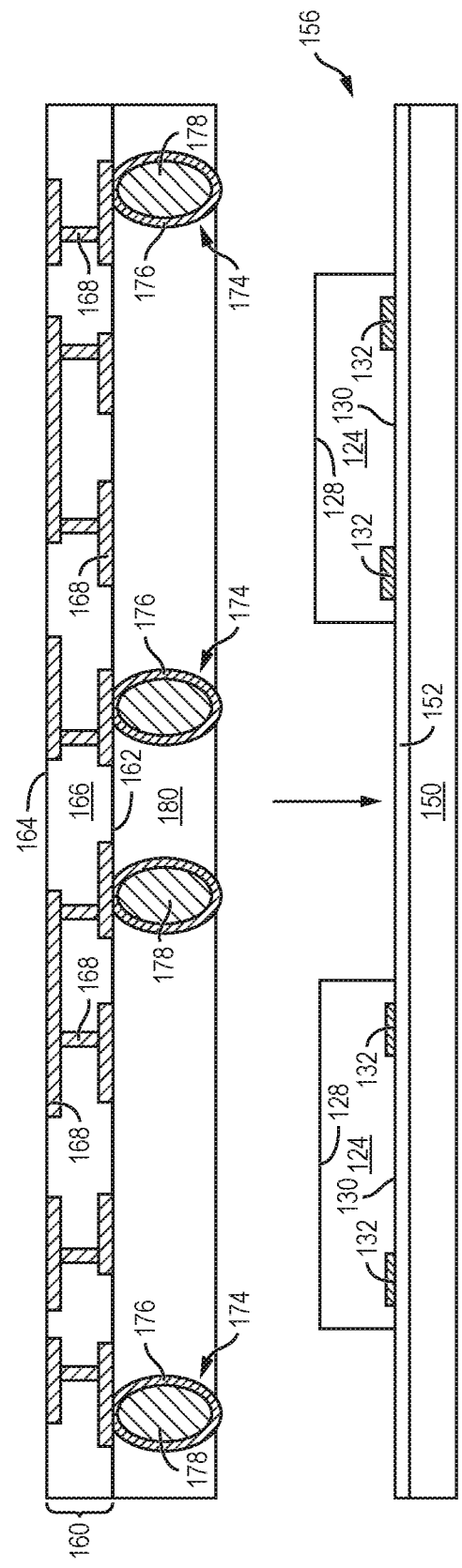
FIG. 5a
FIG. 5b

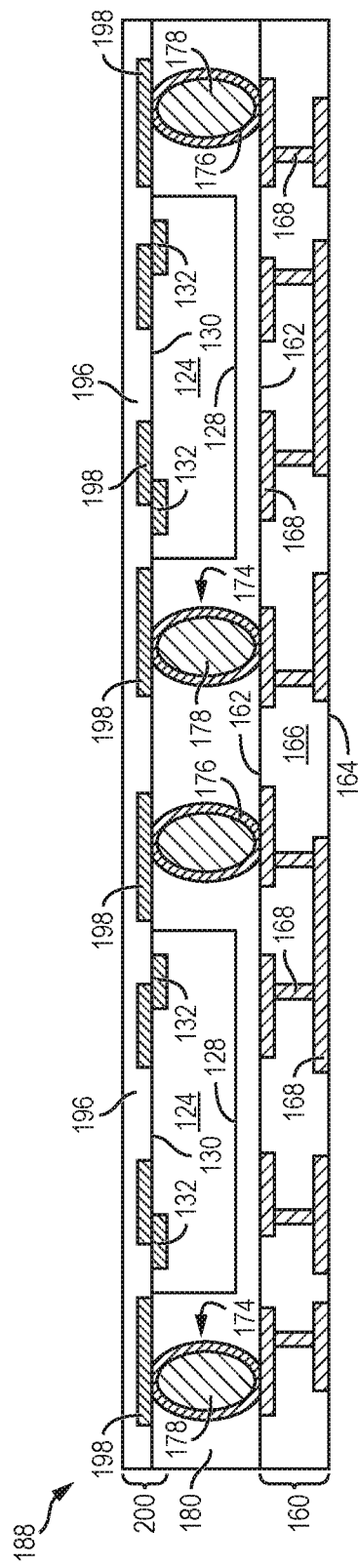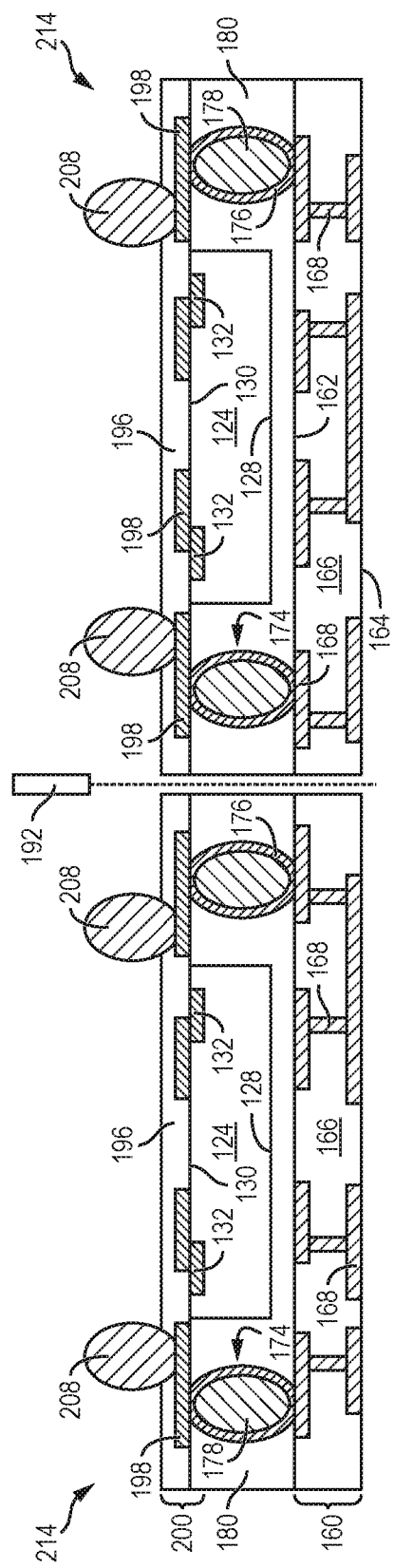

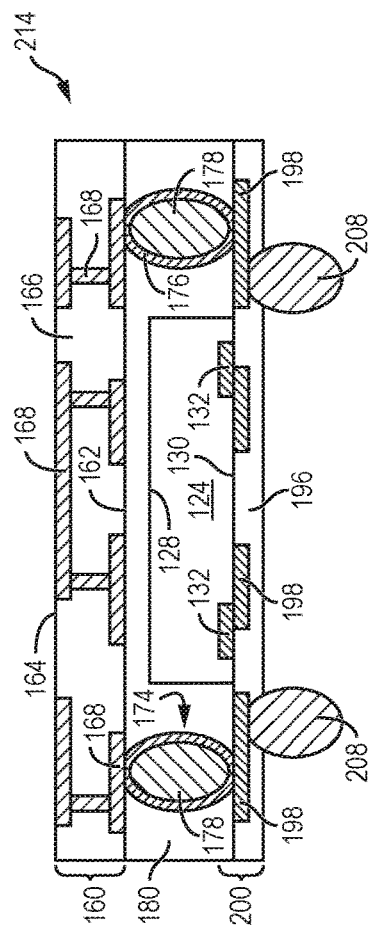
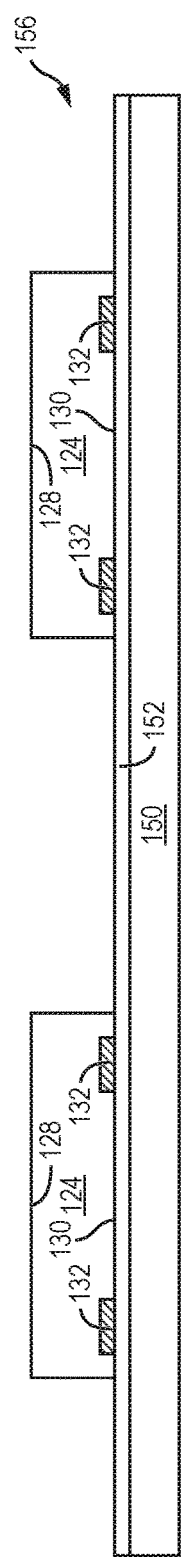
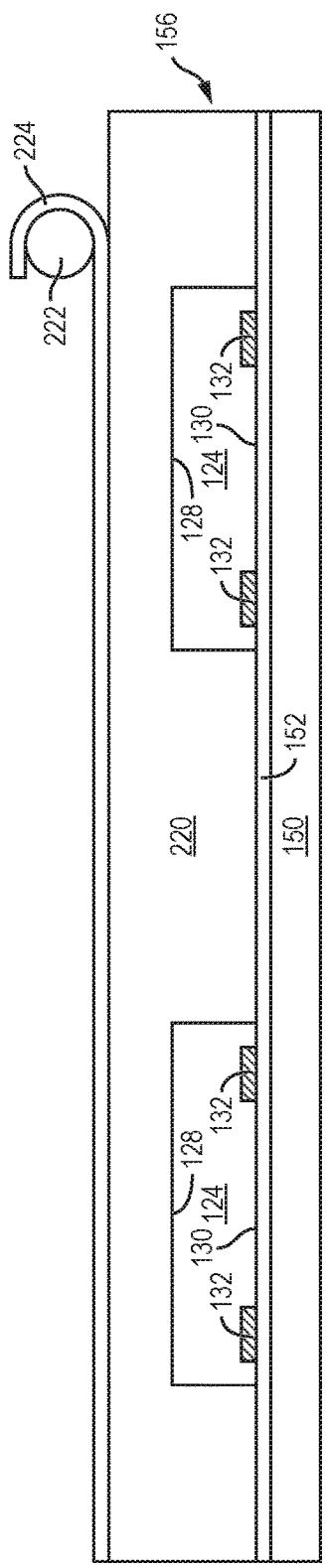
FIG. 5g
FIG. 6a
FIG. 6b

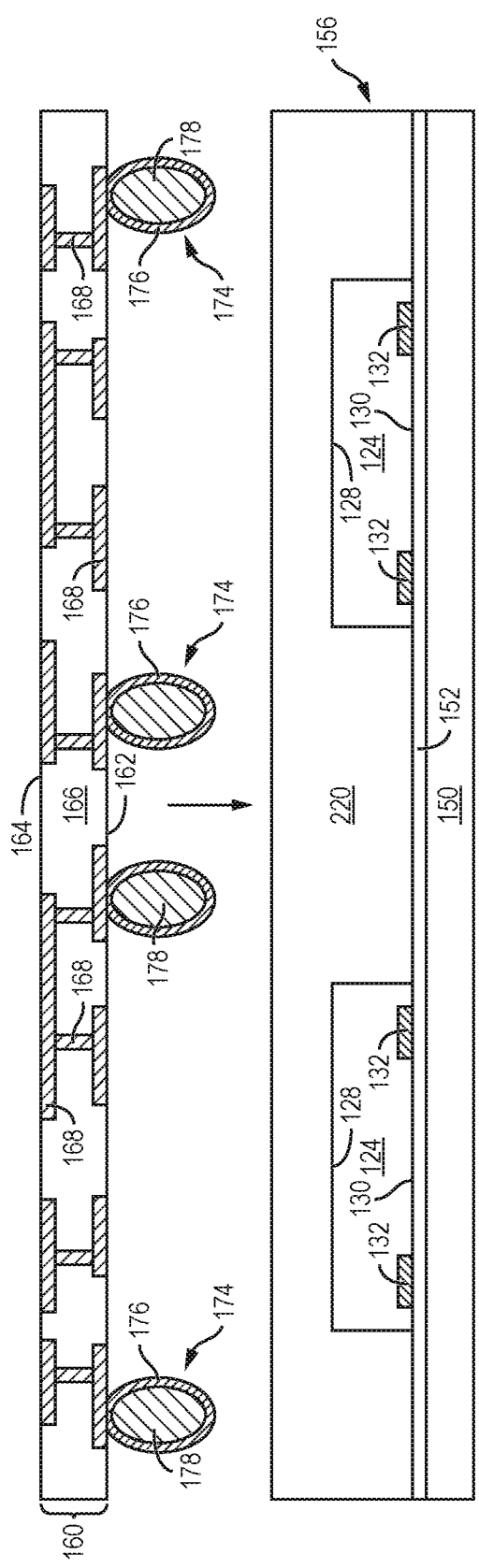
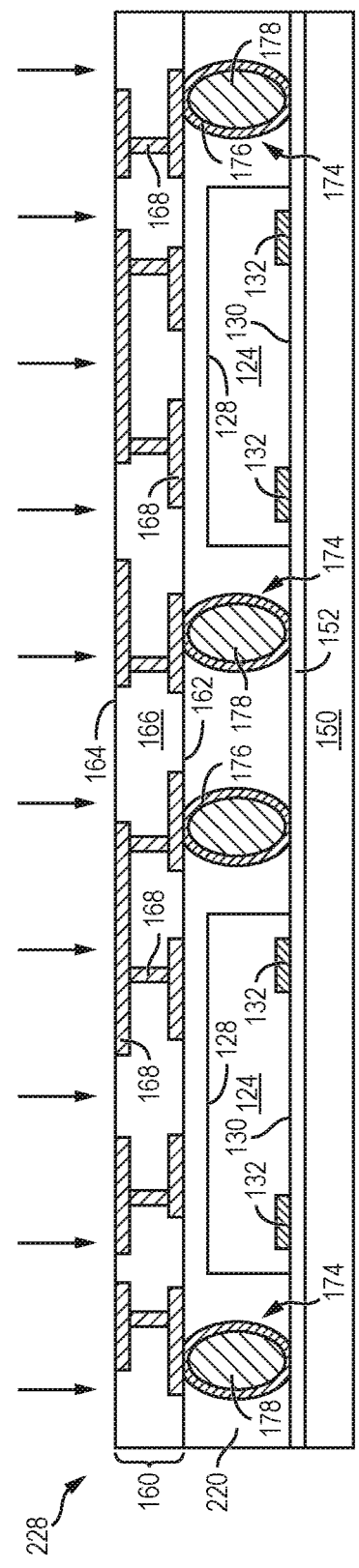
FIG. 6c
FIG. 6d

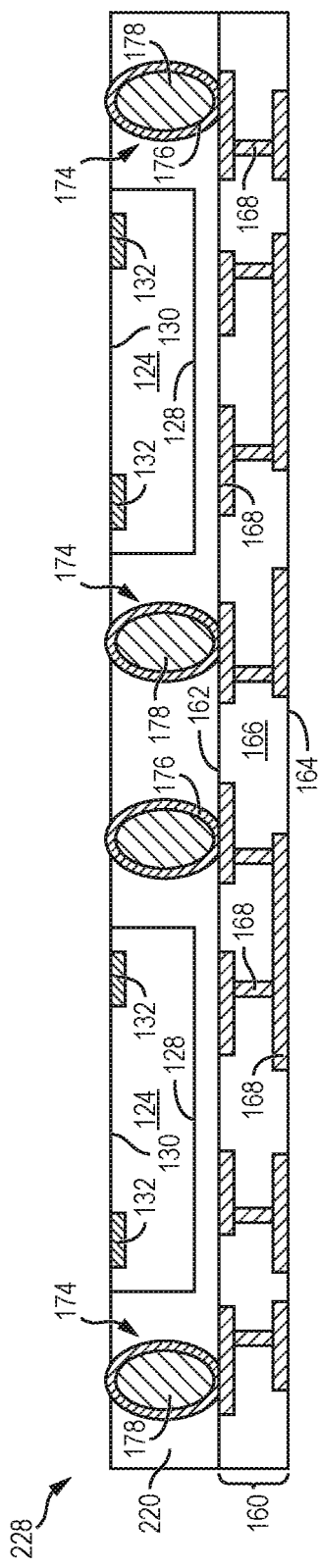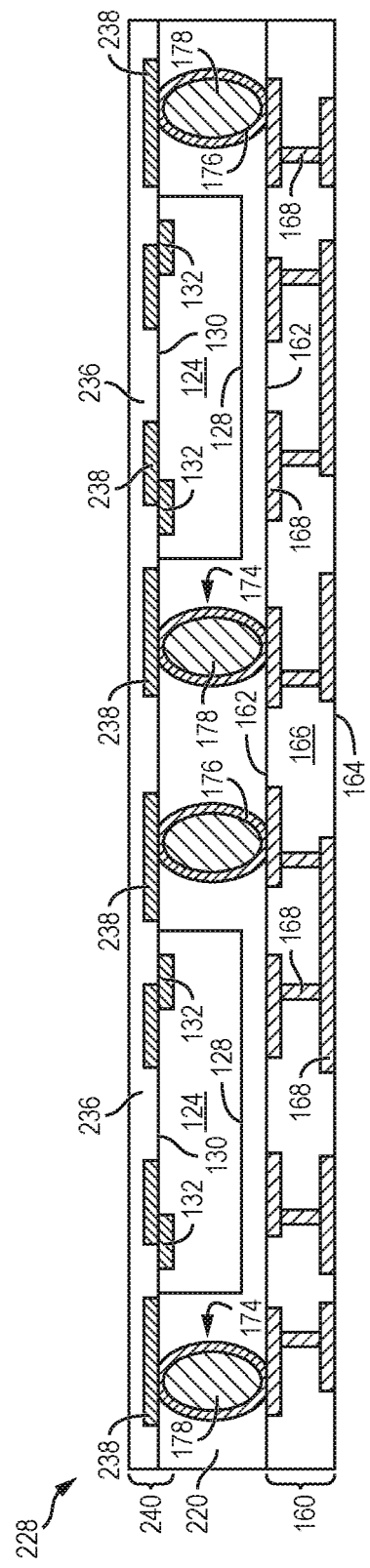

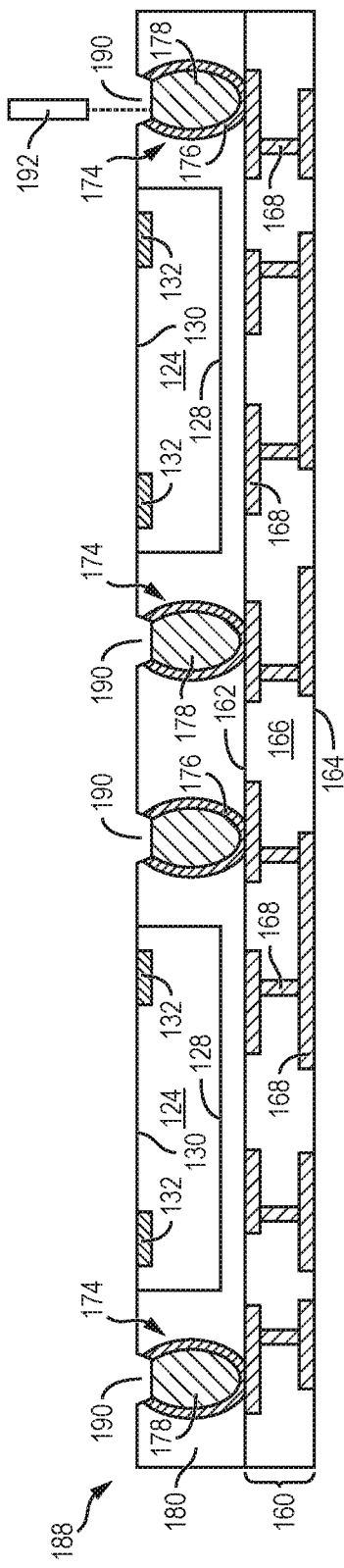
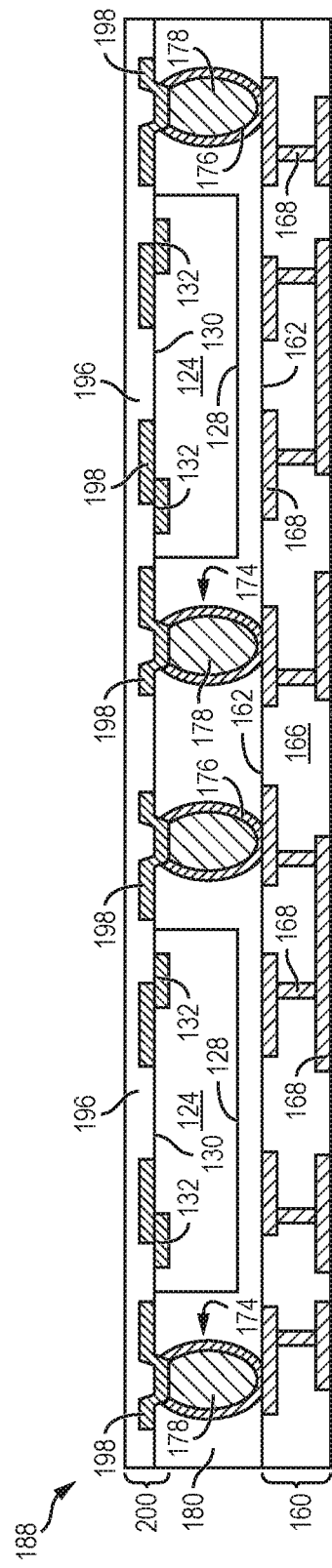
FIG. 7a
FIG. 7b

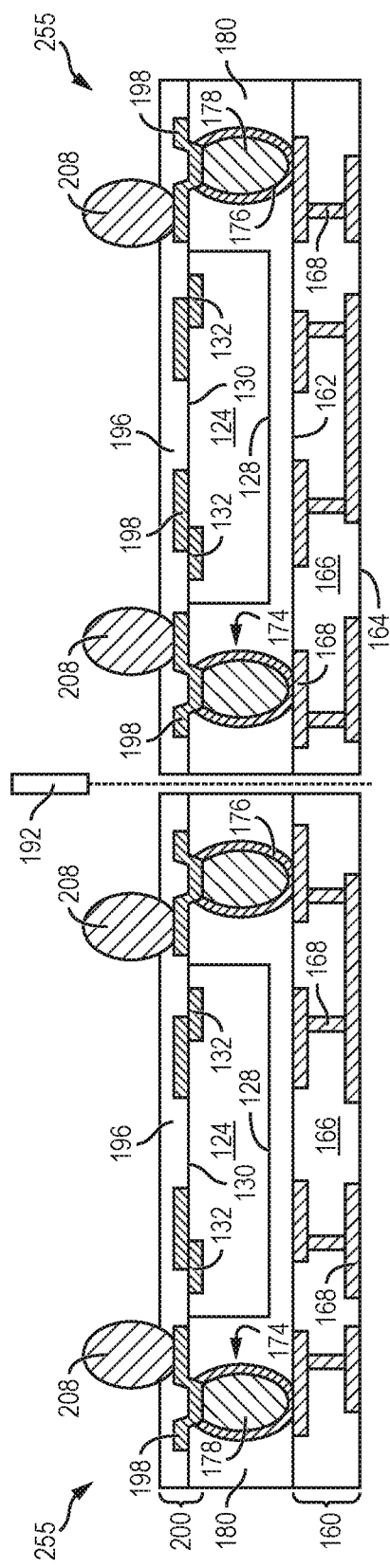
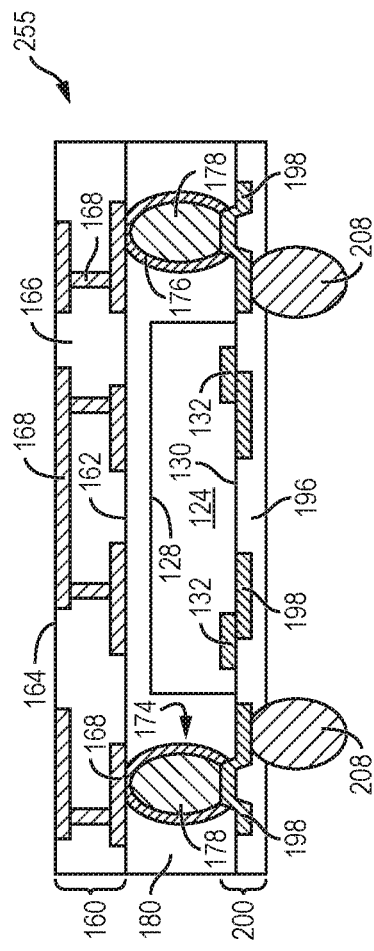
FIG. 7c
FIG. 7d

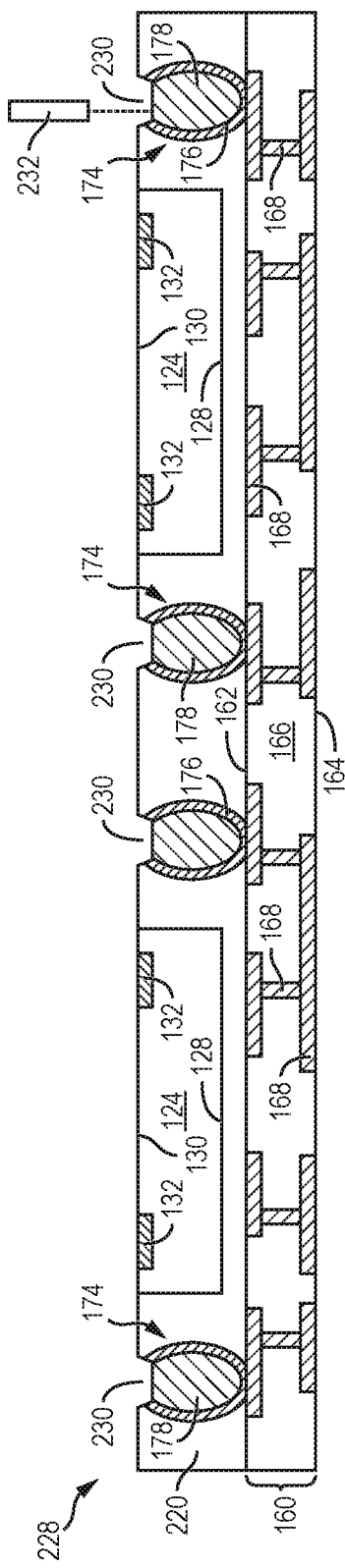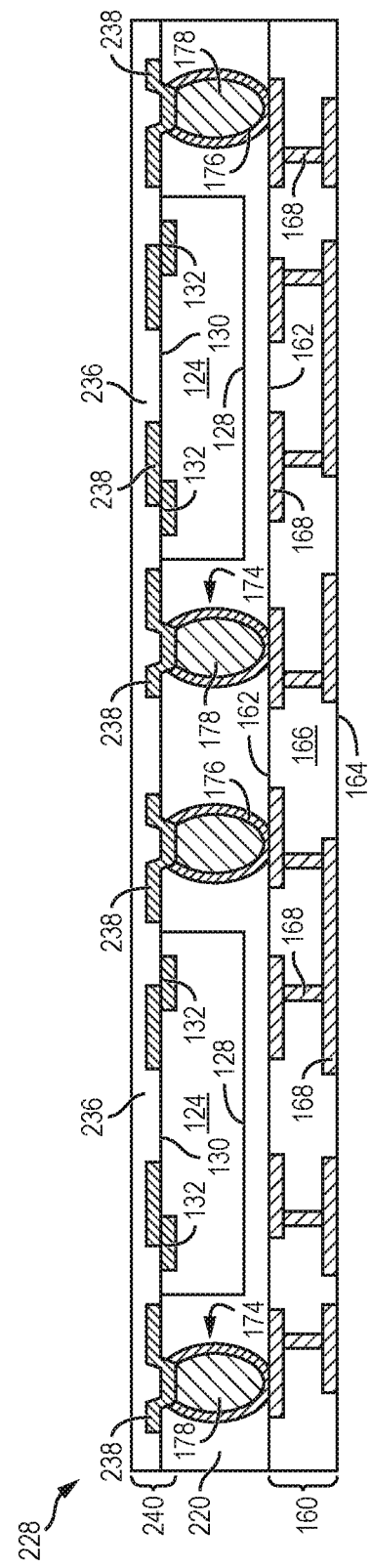

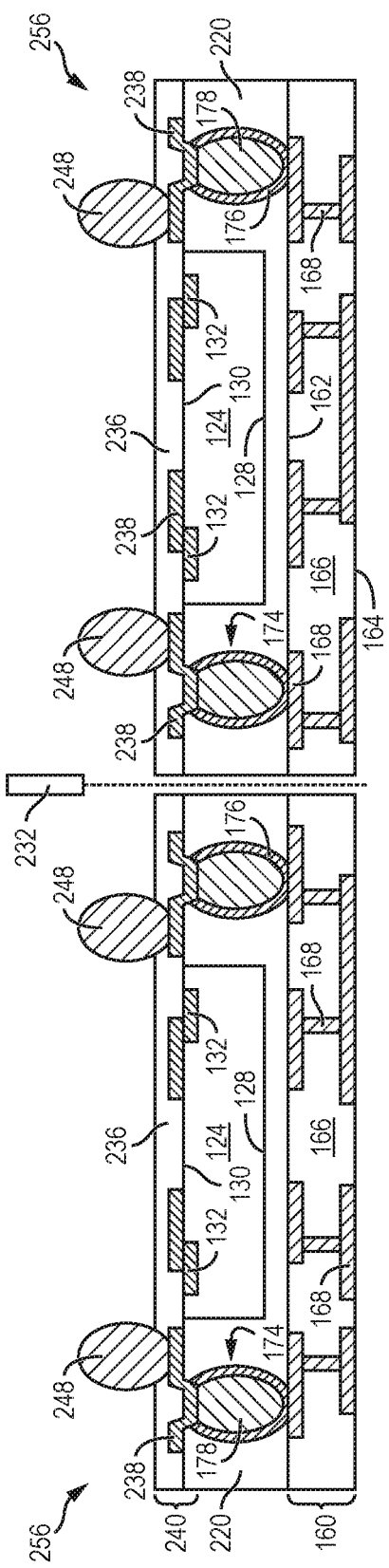
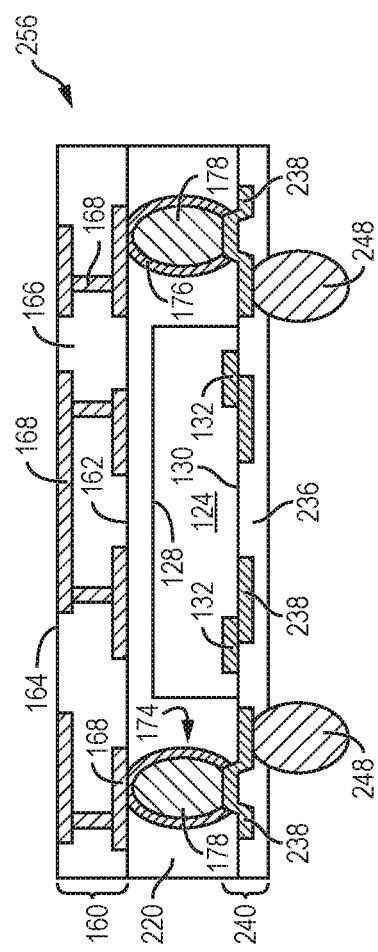
FIG. 8c
FIG. 8d

SEMICONDUCTOR DEVICE AND METHOD OF FORMING 3D DUAL SIDE DIE EMBEDDED BUILD-UP SEMICONDUCTOR PACKAGE

CLAIM TO DOMESTIC PRIORITY

The present application is a continuation of U.S. patent application Ser. No. 15/130,452, filed Apr. 15, 2016, which is a division of U.S. patent application Ser. No. 14/220,336, now U.S. Pat. No. 9,362,161, filed Mar. 20, 2014, which applications are incorporated herein by reference.

FIELD OF THE INVENTION

The present invention relates in general to semiconductor devices and, more particularly, to a semiconductor device and method of forming a three dimensional (3D) dual side die-embedded build-up semiconductor package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

In a conventional semiconductor package, an encapsulant is deposited over a semiconductor die or an insulating layer is formed over the semiconductor die and a temporary carrier as a reconfigured or reconstituted wafer. For example, encapsulant can be deposited over the semiconductor die and carrier by mold injection or can be applied using a compression molding process. Similarly, insulating layers may be built up or formed over the carrier to embed the semiconductor die. Thereafter, the carrier is removed to expose the semiconductor die. A build-up interconnect structure, comprising one or more conductive layers, is typically formed over the exposed semiconductor die for electrical redistribution. A build-up interconnect structure may also be formed around the semiconductor die. In either case, providing 3D vertical electrical interconnect through a conventional semiconductor package often requires the formation of multiple layers around the semiconductor die, formation of vias by, e.g., laser drilling, and deposition of conductive material in the vias.

The semiconductor die is known to vertically and laterally shift during encapsulation, particularly during mold injection, which can cause misalignment of the build-up interconnect structure. Further, a mismatch between the coefficient of thermal expansion (CTE) of the encapsulant and carrier can cause warpage in the reconfigured wafer. A CTE difference between the encapsulant and semiconductor die can cause delamination due to thermal stress. Encapsulation for embedded wafer level ball grid array (eWLB) fabrication requires very fine volume control and generates low throughput due to lengthy molding cure times. Forming an insulating layer over the semiconductor die can attract foreign materials, generate wasteful byproducts, and requires excess manufacturing steps with increased cost. Forming an insulating layer over a semiconductor die can further result in roughened surfaces around the insulating layer. The roughened surfaces can impact adhesion between the insulating layer and additional components disposed on the insulating layer. The roughened surfaces can further impact the electrical characteristics of conductive layers formed on the insulating layer as part of the build-up interconnect structure. For example, when a conductive layer is applied over the roughened surfaces for redistribution, the interface between the insulating layer and conductive layer lacks linearity, i.e., contains imperfections along the interface due to the roughened surfaces of the insulating layer. Imperfections along the interface can cause higher resistance, poorer transmission quality, and degrade redistribution performance across the conductive layer. In addition, forming vertical interconnect structures in a semiconductor package by forming vias and filling the vias with conductive material requires specialized manufacturing procedures, numerous fabrication steps, and increased cost.

BRIEF DESCRIPTION OF THE DRAWINGS

FIGS. 4a-4b illustrate a process of mounting bumps to a substrate;

FIGS. 5a-5g illustrate a process of disposing an insulating film over a substrate with bumps and embedding a plurality of semiconductor die within the insulating film to form a semiconductor package;

FIGS. 6a-6h illustrate a process of disposing an insulating film over a plurality of semiconductor die to embed the semiconductor die and mounting a substrate with bumps over the semiconductor die to form a semiconductor package;

FIGS. 7a-7d illustrate another process of disposing an insulating film over a substrate with bumps and embedding a plurality of semiconductor die within the insulating film to form a semiconductor package;

FIGS. 8a-8d illustrate another process of disposing an insulating film over a plurality of semiconductor die to embed the semiconductor die and mounting a substrate with bumps over the semiconductor die to form a semiconductor package;

DETAILED DESCRIPTION OF THE DRAWINGS

Figure 1:
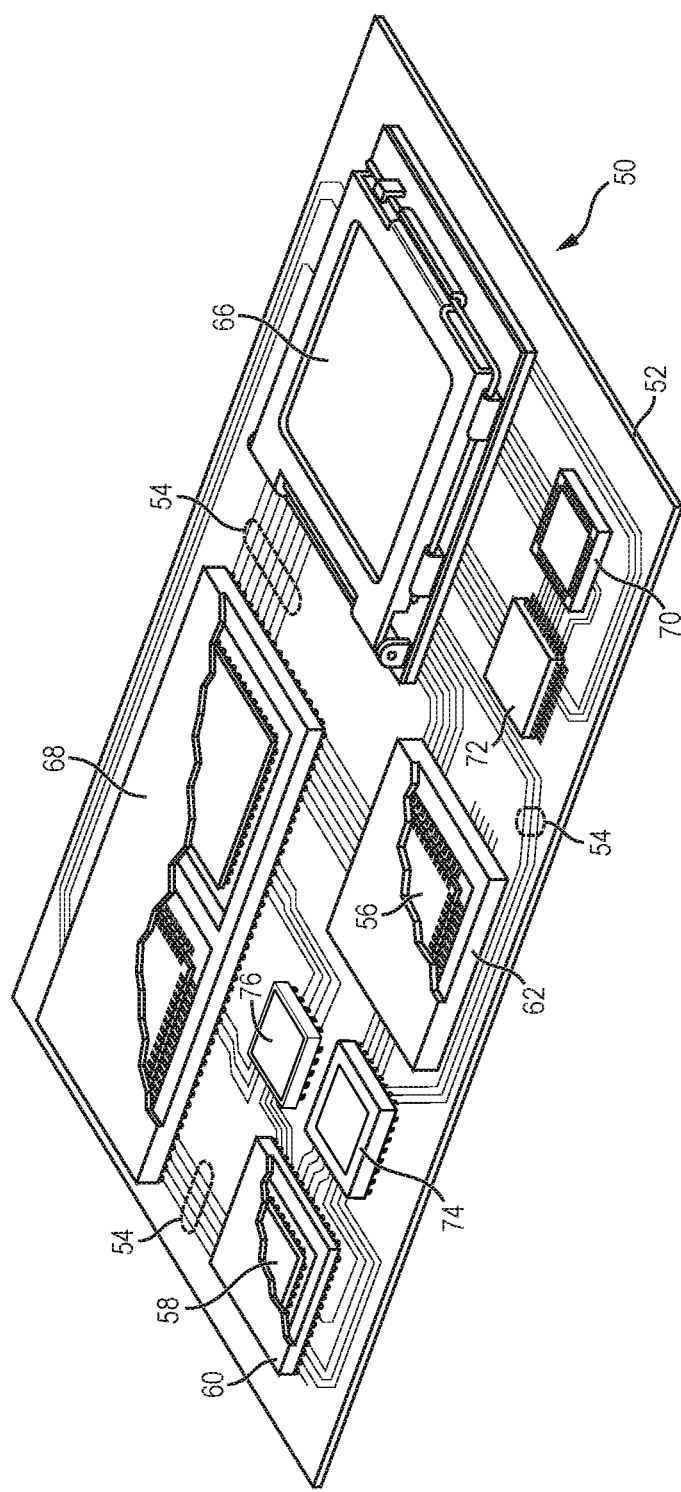
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. eWLB 74 is a fan-out wafer level package and WLCSP 76 is a fan-in wafer level package. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
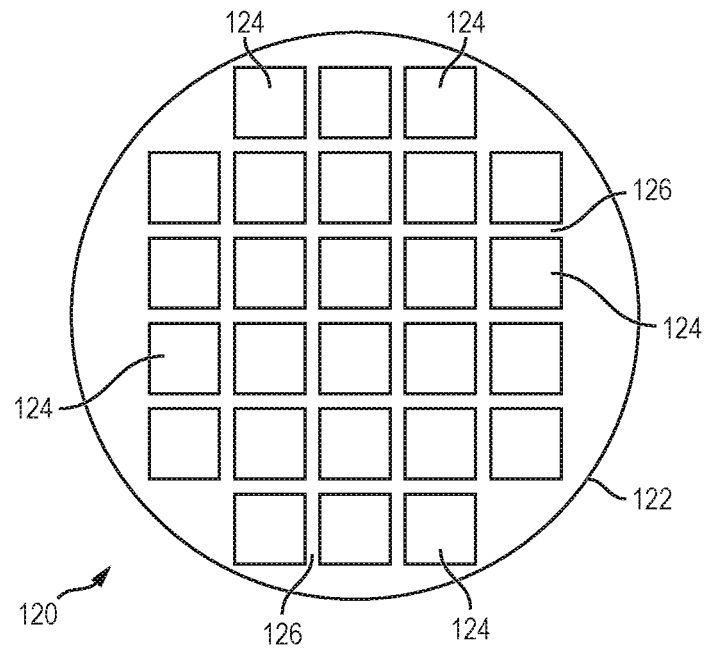
FIGS. 2a-2d illustrate a semiconductor wafer with a plurality of semiconductor die separated by a saw street including testing of the semiconductor die in FIG. 2c.

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 200-300 millimeters (mm). In another embodiment, semiconductor wafer 120 has a width or diameter of 100-450 mm.

Figure 2B:
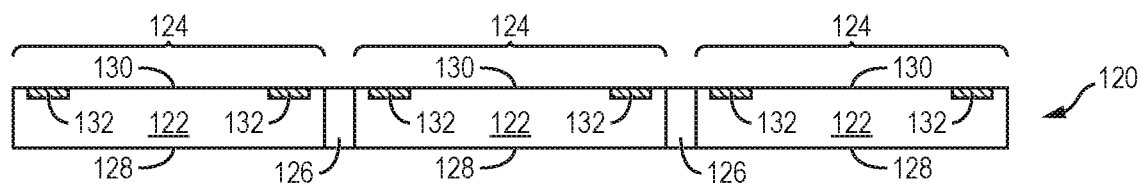

FIG. 2b shows a cross-sectional view of a portion of semiconductor wafer 120. Each semiconductor die 124 has a back or non-active surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of aluminum (Al), copper (Cu), tin (Sn), nickel (Ni), gold (Au), or silver (Ag) or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 2b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet (UV) light, or metallurgical microscope. Semiconductor wafer 120 is inspected for structural characteristics including warpage, thickness variation, surface particulates, irregularities, cracks, delamination, and discoloration.

Figure 2C:
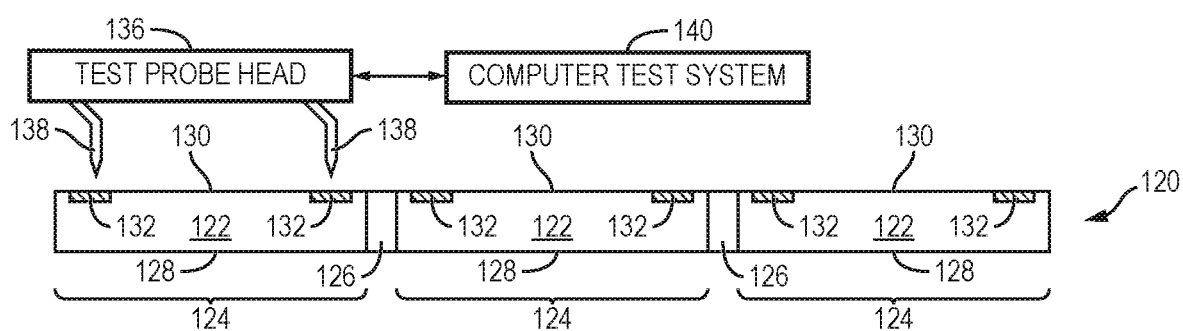

The active and passive components within semiconductor die 124 undergo testing at the wafer level for electrical performance and circuit function. Each semiconductor die 124 is tested for functionality and electrical parameters, as shown in FIG. 2c, using a probe 138 or other testing device. Test probe head 136 includes a plurality of probes 138. Probes 138 are used to make electrical contact with nodes or contact pads 132 on each semiconductor die 124 and provide electrical stimuli to the contact pads. Semiconductor die 124 responds to the electrical stimuli, which is measured by computer test system 140 and compared to an expected response to test functionality of the semiconductor die 124. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 2D:
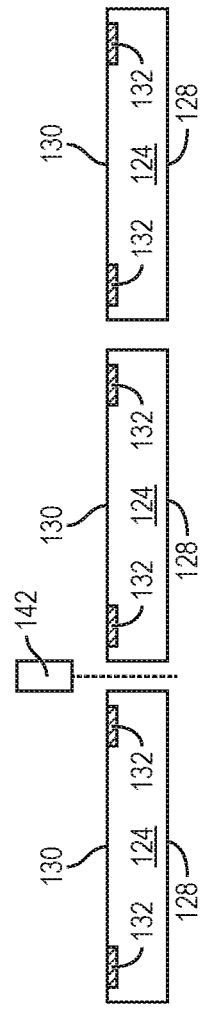

In FIG. 2d, semiconductor wafer 120 is singulated through saw street 126 using a saw blade or laser cutting tool 142 into individual semiconductor die 124. The individual semiconductor die 124 can be inspected and electrically tested for identification of KGD post singulation.

Figure 3A:
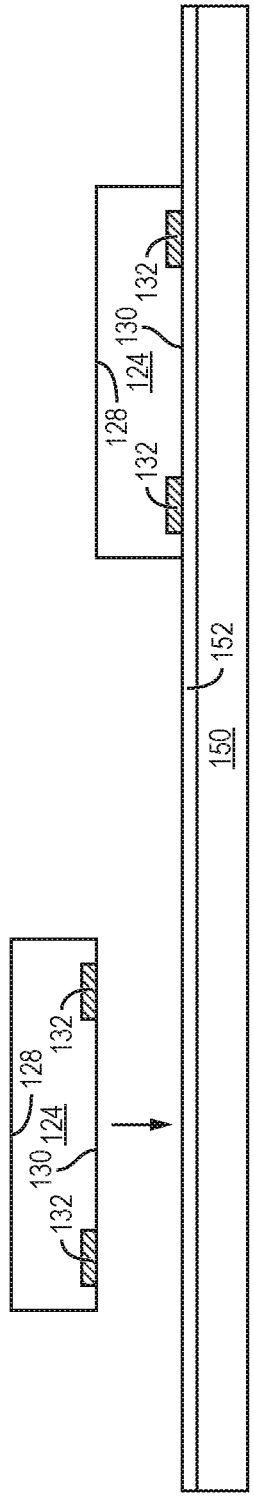
FIGS. 3a-3b illustrate a process of mounting a plurality of semiconductor die to a carrier to form a reconstituted wafer.
Figure 3B:
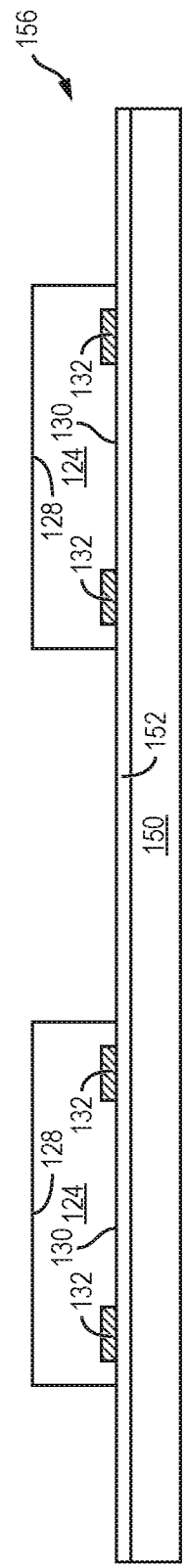

FIGS. 3a-3b illustrate, in relation to FIGS. 1 and 2a-2d, a process of mounting a semiconductor die to a carrier to form a reconstituted wafer. FIG. 3a shows a cross-sectional view of a portion of a carrier or carrier frame 150. A carrier tape 152 is formed over carrier 150. Carrier 150 and/or carrier tape 152 contain sacrificial base material such as silicon, polymer, beryllium oxide, glass, or other suitable low-cost, rigid material for structural support.

Semiconductor die 124 from FIG. 2d are mounted to carrier tape 152 and carrier 150 using, for example, a pick and place operation with active surface 130 oriented toward carrier 150. FIG. 3b shows semiconductor die 124 mounted to carrier tape 152 and carrier 150 with an adhesive layer as a reconstituted or reconfigured wafer 156.

Carrier 150 can be a round or rectangular panel (greater than 300 mm) with capacity for multiple semiconductor die 124. Carrier 150 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 150 is selected independent of the size of semiconductor die 124 or size of semiconductor wafer 120. That is, carrier 150 has a fixed or standardized size, which can accommodate various size semiconductor die 124 singulated from one or more semiconductor wafers 120. In one embodiment, carrier 150 is circular with a diameter of 330 mm. In another embodiment, carrier 150 is rectangular with a width of 560 mm and length of 600 mm. Semiconductor die 124 may have dimensions of 10 mm by 10 mm, which are placed on the standardized carrier 150. Alternatively, semiconductor die 124 may have dimensions of 20 mm by 20 mm, which are placed on the same standardized carrier 150. Accordingly, standardized carrier 150 can handle any size semiconductor die 124, which allows subsequent semiconductor processing equipment to be standardized to a common carrier, i.e., independent of die size or incoming wafer size. Semiconductor packaging equipment can be designed and configured for the standard carrier 150 using a common set of processing tools, equipment, and bill of materials to process any semiconductor die size from any incoming wafer size. The common or standardized carrier 150 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

Reconstituted wafer 156 can be processed into many types of semiconductor packages, including flipchip packages, eWLB, WLCSP, reconstituted or embedded wafer level chip scale packages (eWLCSP), fan-out WLCSP, 3D packages, such as package-on-package (PoP), or other semiconductor packages. Reconstituted wafer 156 is configured according to the specifications of the resulting semiconductor package. In one embodiment, semiconductor die 124 are placed on carrier 150 in a high-density arrangement, i.e., 300 micrometers (µm) apart or less, for processing fan-in devices. In another embodiment, semiconductor die 124 are separated by a distance of 50 µm on carrier 150. The distance between semiconductor die 124 on carrier 150 is optimized for manufacturing the semiconductor packages at the lowest unit cost. The larger surface area of carrier 150 accommodates more semiconductor die 124 and lowers manufacturing cost as more semiconductor die 124 are processed per reconstituted wafer 156. The number of semiconductor die 124 mounted to carrier 150 can be greater than the number of semiconductor die 124 singulated from semiconductor wafer 120. Carrier 150 and reconstituted wafer 156 provide the flexibility to manufacture many different types of semiconductor packages using different size semiconductor die 124 from different sized semiconductor wafers 120.

FIGS. 4a-4b illustrate a process of mounting bumps to a substrate. FIG. 4a shows a cross-sectional view of a substrate, interposer, or PCB 160 containing insulating material 166 and conductive layers 168 including surface 162 of substrate 160 and surface 164 opposite surface 162. In one embodiment, substrate 160 contains one or more laminated layers of prepreg, FR-4, FR-1, CEM-1, or CEM-3 with a combination of phenolic cotton paper, epoxy, resin, woven glass, matte glass, polyester, and other reinforcement fibers or fabrics. Substrate 160 can also be a multi-layer flexible laminate, ceramic, copper foil, glass, or semiconductor wafer including an active surface containing one or more transistors, diodes, and other circuit elements to implement analog circuits or digital circuits. The insulating material 166 may contain one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), polymer, or other dielectric material having similar structural and insulating properties. Conductive layers 168 contain Al, Cu, Sn, Ni, Au, Ag, Ti, W, or other suitable electrically conductive material formed using a patterning and metal deposition process such as sputtering, electrolytic plating, and electroless plating. Conductive layers 168 include lateral redistribution layers (RDL) and vertical conductive vias to provide electrical interconnect through substrate 160. Portions of conductive layers 168 are electrically common or electrically isolated according to the design and function of the semiconductor die 124 mounted to substrate 160.

FIG. 4a further shows a bump material or interconnect structure is disposed over surface 162 of substrate 160 using an evaporation, electrolytic plating, electroless plating, ball drop, or screen printing process to form bumps or balls 174. In one embodiment, bumps 174 include an outer layer 176 and a core 178. Outer layer 176 contains Cu or solder. Alternatively, outer layer 176 can be Al, Sn, Ni, Au, Ag, Pb, Bi, and combinations thereof, with an optional flux solution. Outer layer 176 can further be eutectic Sn/Pb, high-lead solder, or lead-free solder. Core 178 of bumps 174 may comprise, for example, Cu material. Alternatively, core 178 can be one or more layers of Al, Cu, Sn, Ni, Au, Ag, titanium (Ti), tungsten (W), or other suitable electrically conductive material. Outer layer 176 is disposed around and encapsulates core 178. In one embodiment, bumps 174 constitute copper core solder bumps (CCSBs).

To form bumps 174, core 178 is provided and surface-treated. Core 178 is then electroplated with conductive material to form outer layer 176 around core 178 such that core 178 is embedded within outer layer 176. In some embodiments, core 178 has a higher melting point than outer layer 176 such that during a reflow process, outer layer 176 is reflowed with core 178 being less likely to melt. Bumps 174 are bonded to substrate 160 using a suitable attachment or bonding process. In one embodiment, outer layer 176 is reflowed by heating the material above its melting point. In some applications, outer layer 176 is reflowed a second time to improve electrical contact to substrate 160. Bumps 174 can also be compression bonded or thermocompression bonded to substrate 160. Bumps 174 represent one type of interconnect structure that can be formed over substrate 160.

The interconnect structure can also use conductive paste, stud bump, micro bump, conductive pillar, or other electrical interconnect.

When bumps 174 are mounted to substrate 160, due in part to its higher melting point, core 178 can act as a spacer to help maintain a fixed distance between substrate 160 and additional semiconductor components mounted over bumps 174 opposite substrate 160. Bumps 174 have increased bonding reliability and provide vertical interconnect over substrate 160.

Figure 5C:
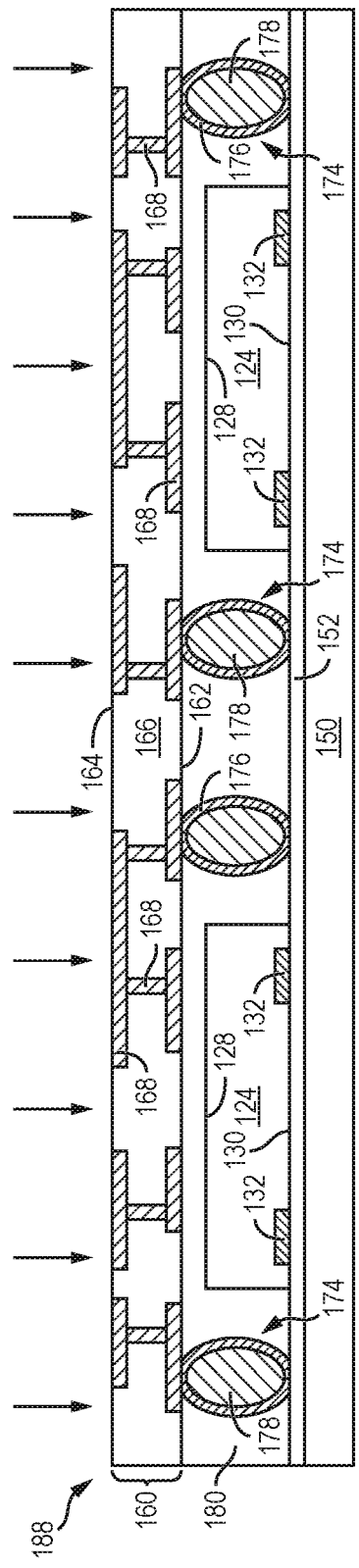

FIGS. 5a-5g illustrate, in relation to FIGS. 1, 2a-2d, 3a-3b, and 4a-4b, a process of disposing an insulating film over a substrate with bumps and embedding a plurality of semiconductor die within the insulating film to form a semiconductor package. FIG. 5a shows a substrate 160, with bumps 174 disposed on surface 162 of substrate 160 similar to the substrate 160 and bumps 174 described in FIGS. 4a-4b.

A prefabricated insulating film, sheet mold, or layer 180 is disposed over substrate 160 and bumps 174 using laminator 182 to embed bumps 174 within insulating film 180. Insulating film 180 is a thin reinforced laminating insulating film, sheet mold, or layer containing one or more glass fibers, glass fillers, or glass cloth. In some embodiments, insulating film 180 includes epoxy, epoxy resin, polymeric materials, thermoset plastic laminate, or other non-conductive materials. In some embodiments, insulating film 180 is a multilayered reinforced film including a plurality of resin layers, polyester film layers, and polypropylene film layers. Insulating film 180 may further include one or more layers of polytetrafluoroethylene, prepreg, FR-4, FR-1, CEM-1, or CEM-3 with a combination of phenolic cotton paper, epoxy, resin, woven glass, matte glass, polyester, and other reinforcement fibers or fabrics.

In one embodiment, a combination of vacuum, heat, and pressure is applied to insulating film 180 in order to facilitate the laminating of insulating film 180 over surface 162 of substrate 160, thereby embedding bumps 174 within insulating film 180. In some embodiments, insulating film 180 is laminated on substrate 160 by vacuum lamination using, e.g., a vacuum hot press, followed by the introduction of heat or heated air in order to cure insulating film 180. In some embodiments, substrate 160 and bumps 174 undergo surface treatment and pre-drying prior to application of insulating film 180. Insulating film 180 covers surface 162 of substrate 160. In some embodiments, a portion of insulating film 180, such as a temporary attach layer 184, is removed after laminating insulating film 180 over substrate 160. In one embodiment, after insulating film 180 is disposed over substrate 160, a portion of outer layer 176 of bumps 174 is exposed from insulating film 180 opposite substrate 160. In some embodiments, a portion of outer layer 176 protrudes above a thickness of insulating film 180. A surface of core 178 may be coplanar with a surface of insulating film 180. Insulating layer 180, as a prefabricated layer, can be tailored to have a predetermined thickness.

FIG. 5b shows reconstituted wafer 156 from FIG. 3b including semiconductor die 124 mounted to carrier 150 with active surface 130 oriented towards carrier 150 and back surface 128 oriented away from carrier 150.

In FIG. 5b, substrate 160 and bumps 174 with insulating film 180 are mounted onto reconstituted wafer 156, i.e., substrate 160 and bumps 174 with insulating film 180 is combined with reconstituted wafer 156. Semiconductor die 124 penetrates insulating film 180 with back surface 128 oriented towards insulating film 180. Bumps 174 make contact with carrier 150. In one embodiment, a combination of vacuum, heat, and pressure is applied to insulating film 180 in order to facilitate the laminating of insulating film 180 over carrier 150, thereby embedding semiconductor die 124 within insulating film 180 between bumps 174. In some embodiments, insulating film 180 is laminated on carrier 150 by vacuum lamination using, e.g., a vacuum hot press, followed by the introduction of heat or heated air in order to cure insulating film 180. In some embodiments, semiconductor die 124 and carrier 150 undergo surface treatment and pre-drying prior to application of insulating film 180. In some embodiments, a portion of insulating film 180 is removed during or after embedding the semiconductor die 124 within insulating film 180.

FIG. 5c shows the combination of substrate 160, bumps 174, insulating film 180, and reconstituted wafer 156, with insulating film 180 covering side surfaces and back surface 128 of semiconductor die 124 to secure semiconductor die 124 and form reconfigured wafer 188. Bumps 174 extend from substrate 160 through insulating film 180 and semiconductor die are disposed adjacent to and between bumps 174. Carrier 150 covers outer layer 176 of bumps 174 opposite substrate 160.

Figure 5D:
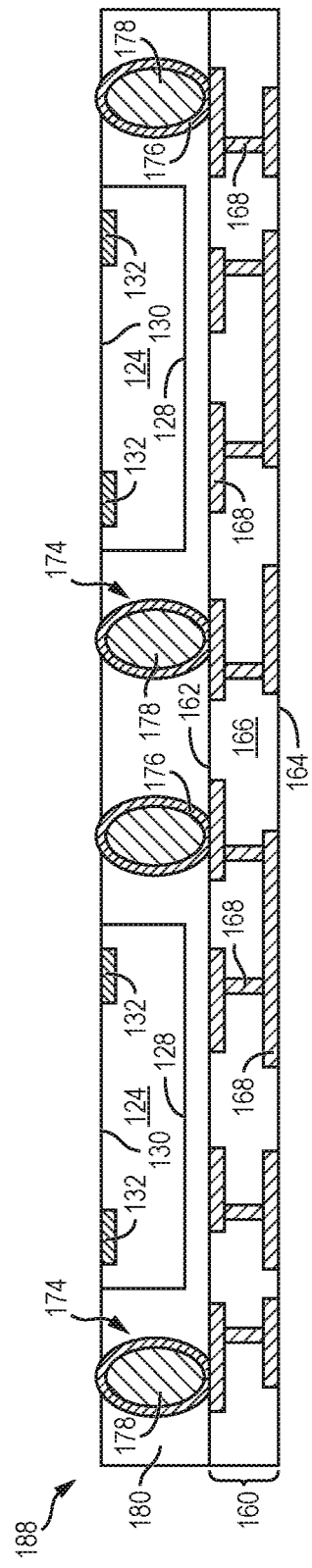

In FIG. 5d, carrier 150 is removed by chemical etching, mechanical peeling, chemical mechanical planarization (CMP), mechanical grinding, thermal bake, UV light, laser scanning, or wet stripping to expose active surface 130 of semiconductor die 124, insulating film 180, and a portion of outer layer 176 of bumps 174. Because insulating film 180 is a prefabricated structure, insulating film 180 is sized such that the removal of carrier 150 conveniently exposes bumps 174. Exposing bumps 174 by removing carrier 150 makes bumps 174 accessible for electrical interconnection without having to form openings and expose bumps 174 through insulating film 180.

In FIG. 5e, a build-up interconnect structure 200 is formed over active surface 130 of semiconductor die 124, bumps 174, and insulating film 180. Build-up interconnect structure 200 comprises insulating layer 196 and conductive layer 198.

Insulating or passivation layer 196 is formed over active surface 130, bumps 174, and insulating film 180 using PVD, CVD, printing, lamination, spin coating, spray coating, sintering, or thermal oxidation. Insulating layer 196 contains one or more layers of SiO2, Si3N4, SiON, Ta2O5, Al2O3, or other material having similar insulating and structural properties. The smooth surfaces of insulating film 180 facilitate an interface between insulating layer 196 and insulating film 180 with reduced imperfections along the interface. Alternatively, insulating layer 196 is a laminated insulating, passivation, dielectric, or epoxy layer, similar to insulating film 180. Insulating layer 196 may further comprise one or more resist layers.

Conductive layer 198 comprises one or more conductive layers formed over insulating film 180 and within insulating layer 196 using PVD, CVD, electrolytic plating, electroless plating process, or other suitable metal deposition process. Conductive layer 198 can be one or more layers of Al, Cu, Sn, Ni, Au, Ag, or other suitable electrically conductive material. The smooth surfaces of insulating film 180 facilitate an interface between conductive layer 198 and insulating film 180 with reduced imperfections along the interface which improves the electrical characteristics of conductive layer 198. One portion of conductive layer 198 is electrically connected to contact pads 132 of semiconductor die 124. Other portions of conductive layer 198 are electrically connected to bumps 174. Other portions of conductive layer 198 can be electrically common or electrically isolated depending on the design and function of semiconductor die 124. In some embodiments, conductive layer 198 provides electrical redistribution between semiconductor die 124 and bumps 174 and to other areas according to the specifications of the semiconductor package. In one embodiment, conductive layer 198 is a substantially flat circuit pattern. Outer layer 176 is reflowed to improve electrical contact between conductive layer 198 and bumps 174. During the formation of interconnect structure 200, core 178 provides structural stability and maintains a fixed distance between substrate 160 and interconnect structure 200.

In FIG. 5f, a portion of insulating layer 196 is removed by an exposure or development process, LDA, etching, or other suitable process to form openings in insulating layer 196 and expose portions of conductive layer 198 for subsequent electrical interconnection. Bump material is deposited within the openings in insulating layer 196 over conductive layer 198 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 198 using a suitable attachment or bonding process. In one embodiment, the bump material is reflowed by heating the material above its melting point to form balls or bumps 208. In some applications, bumps 208 are reflowed a second time to improve electrical contact to conductive layer 198. Bumps 208 can also be compression bonded or thermocompression bonded to conductive layer 198. Bumps 208 represent one type of interconnect structure that can be formed over conductive layer 198. The interconnect structure can also use conductive paste, stud bump, micro bump, or other electrical interconnect.

FIG. 5f further shows reconfigured wafer 188 is singulated using a saw blade or laser cutting tool 192 into individual semiconductor packages 214. Alternatively, application of bumps 208 may occur post-singulation.

FIG. 5g shows a semiconductor package 214 after singulation from reconstituted wafer 188 with semiconductor die 124 embedded within insulating film 180 and build up interconnect structure 200 formed over active surface 130 of semiconductor die 124. Interconnect structure 200 includes a combination of insulating layer 196, conductive layer 198, and bumps 208. Interconnect structure 200 over insulating film 180 provides high density wiring patterns to achieve significant performance improvements. Interconnect structure 200 has a minimized thickness and reduces process steps because conductive layer 198 can be formed directly on the portion of outer layer 176 of bumps 174 exposed from insulating film 180 without having to etch or drill through insulating film 180. Interconnect structure 200 has improved reliability and is efficient for 3D integration and vertical stacking over semiconductor die 124. Further, interconnect structure 200 is a low cost addition to semiconductor package 214. In one embodiment, semiconductor package 214 is a 3D dual side die-embedded build-up eWLB package-on-package (PoP).

Bumps 174 embedded within insulating film 180 provide vertical electrical interconnect between substrate 160 and interconnect structure 200. Bumps 174 reduce process steps because semiconductor package 214 does not require laser drilling and via filling to establish electrical interconnection between substrate 160 and interconnect structure 200. Bumps 174 further provide enhanced structural support because core 178 maintains a fixed distance between interconnect structure 200 and substrate 160. Substrate 160 further reduces process steps because substrate 160 can provide routing and electrical redistribution for semiconductor package 214 over back surface 128 of semiconductor die opposite interconnect structure 200 without the additional process steps required to form an RDL over back surface 128.

Semiconductor package 214, with prefabricated insulating film 180 and substrate 160, reduces the need to apply grinding processes to expose conductive layers or form planar surfaces. Issues arising from controlling the volume of encapsulation materials, molding compound, or conventional insulating materials are mitigated because insulating film 180 is a prefabricated film layer and can be pre-tailored to meet the specifications of the semiconductor package 214. Semiconductor package 214, with interconnect structure 200 and substrate 160 over opposing sides of semiconductor package 214, is suitable for stacking with additional semiconductor components.

Insulating film 180 embeds and supports semiconductor die 124 with reduced process steps. Insulating film 180, as a prefabricated component laminated over semiconductor die 124, does not require being formed or built up over the semiconductor die 124. Insulating film 180 reduces process steps because insulating film 180 and other prefabricated layers similar to insulating film 180 can be processed and applied continuously over semiconductor die 124. Insulating film 180 is not susceptible to complications arising from the application of conventional insulating materials. For example, as a prefabricated structure, insulating film 180 reduces the formation of voids, roughness, and imperfections generated by conventional liquid coating processes. Insulating film 180 reduces the likelihood of warpage in a semiconductor package. Insulating film 180 improves environmental conditions by, e.g., reducing solvent evaporation and the creation of wasteful byproducts typically generated with liquid insulating materials. Insulating film 180 has a reduced CTE, and high insulation reliability. Insulating film 180 reduces shifting of semiconductor die 124 during the formation of interconnect structure 200. Insulating film 180 has advanced adhesive properties and smooth surfaces which facilitates the formation of interconnect structure 200 and improves the electrical conductivity of conductive layer 198. Insulating film 180 can be reinforced with glass fibers, glass fillers, or glass cloth, to form a robust and secure embedding material for semiconductor die 124 and provide enhanced structural stability across the thickness of semiconductor package 214.

FIGS. 6a-6h illustrate, in relation to FIGS. 1, 2a-2d, 3a-3b, and 4a-4b, a process of disposing an insulating film over a plurality of semiconductor die to embed the semiconductor die and mounting a substrate with bumps over the semiconductor die to form a semiconductor package.

FIG. 6a shows reconstituted wafer 156 from FIG. 3b including semiconductor die 124 mounted to carrier 150 with active surface 130 oriented towards carrier 150 and back surface 128 oriented away from carrier 150.

In FIG. 6b, a prefabricated insulating film, sheet mold, or layer 220 is disposed over carrier 150 and semiconductor die 124 using laminator 222 to embed semiconductor die 124 within insulating film 220. Insulating film 220 is a thin reinforced laminating insulating film, sheet mold, or layer containing one or more glass fibers, glass fillers, or glass cloth similar to insulating film 180. In some embodiments, insulating film 220 includes epoxy, epoxy resin, polymeric materials, thermoset plastic laminate, or other non-conductive materials. In some embodiments, insulating film 220 is a multilayered reinforced film including a plurality of resin layers, polyester film layers, and polypropylene film layers. Insulating film 220 may further include one or more layers of polytetrafluoroethylene prepreg, FR-4, FR-1, CEM-1, or CEM-3 with a combination of phenolic cotton paper, epoxy, resin, woven glass, matte glass, polyester, and other reinforcement fibers or fabrics.

In one embodiment, a combination of vacuum, heat, and pressure is applied to insulating film 220 in order to facilitate the laminating of insulating film 220 over carrier 150 and semiconductor die 124, thereby embedding semiconductor die 124 within insulating film 220. In some embodiments, insulating film 220 is laminated on carrier 150 by vacuum lamination using, e.g., a vacuum hot press, followed by the introduction of heat or heated air in order to cure insulating film 220. In some embodiments, carrier 150 and semiconductor die 124 undergo surface treatment and pre-drying prior to application of insulating film 220. Insulating film 220 covers carrier 150. In some embodiments, a portion of insulating film 220, such as a temporary attach layer 224, is removed after laminating insulating film 220 over carrier 150. Insulating layer 220, as a prefabricated layer, can be tailored to have a predetermined thickness.

FIG. 6c shows a substrate 160, with bumps 174 disposed on surface 162 of substrate 160 similar to the substrate 160 and bumps 174 described in FIGS. 4a-4b. Substrate 160 with bumps 174 is mounted onto reconstituted wafer 156 with surface 162 of substrate 160 oriented towards insulating film 220. Bumps 174 penetrate insulating film 220 and bumps 174 extend over side surfaces of semiconductor die 124. In one embodiment, a combination of vacuum, heat, and pressure is applied to insulating film 220 in order to facilitate the mounting of substrate 160 over carrier 150. In some embodiments, substrate 160 is mounted over reconstituted wafer 156 using e.g., a vacuum hot press, followed by the introduction of heat or heated air in order to cure insulating film 220. In some embodiments, bumps 174 and substrate 160 undergo surface treatment and pre-drying prior to mounting of bumps 174 and substrate 160 to insulating film 220.

FIG. 6d shows the combination of substrate 160, bumps 174, insulating film 220, and reconstituted wafer 156, with insulating film 220 covering side surfaces and back surface 128 of semiconductor die 124 to secure semiconductor die 124 and form reconfigured wafer 228. Bumps 174 extend from substrate 160 through insulating film 220 and semiconductor die are disposed adjacent to and between bumps 174.

In FIG. 6e, carrier 150 is removed by chemical etching, mechanical peeling, CMP, mechanical grinding, thermal bake, UV light, laser scanning, or wet stripping to expose active surface 130 of semiconductor die 124, insulating film 220, and a portion of outer layer 176 of bumps 174. Because insulating film 220 is a prefabricated structure, insulating film 220 is sized such that the removal of carrier 150 conveniently exposes bumps 174. Exposing bumps 174 by removing carrier 150 makes bumps 174 accessible for electrical interconnection without having to form openings and expose bumps 174 through insulating film 220.

In FIG. 6f, a build-up interconnect structure 240 is formed over active surface 130 of semiconductor die 124, bumps 174, and insulating film 220. Build-up interconnect structure 240 comprises insulating layer 236 and conductive layer 238.

Insulating or passivation layer 236 is formed over active surface 130, bumps 174, and insulating film 220 using PVD, CVD, printing, lamination, spin coating, spray coating, sintering, or thermal oxidation. Insulating layer 236 contains one or more layers of SiO2, Si3N4, SiON, Ta2O5, Al2O3, or other material having similar insulating and structural properties. The smooth surfaces of insulating film 220 facilitate an interface between insulating layer 236 and insulating film 220 with reduced imperfections along the interface. Alternatively, insulating layer 236 is a laminated insulating, passivation, dielectric, or epoxy layer, similar to insulating film 220. Insulating layer 236 may further comprise one or more resist layers.

Conductive layer 238 comprises one or more conductive layers formed over insulating film 220 and within insulating layer 236 using PVD, CVD, electrolytic plating, electroless plating process, or other suitable metal deposition process. Conductive layer 238 can be one or more layers of Al, Cu, Sn, Ni, Au, Ag, or other suitable electrically conductive material. The smooth surfaces of insulating film 220 facilitate an interface between conductive layer 238 and insulating film 220 with reduced imperfections along the interface which improves the electrical characteristics of conductive layer 238. One portion of conductive layer 238 is electrically connected to contact pads 132 of semiconductor die 124. Other portions of conductive layer 238 are electrically connected to bumps 174. Other portions of conductive layer 238 can be electrically common or electrically isolated depending on the design and function of semiconductor die 124. In some embodiments, conductive layer 238 provides electrical redistribution between semiconductor die 124 and bumps 174 and to other areas according to the specifications of the semiconductor package. In one embodiment, conductive layer 238 is a substantially flat circuit pattern. Outer layer 176 is reflowed to improve electrical contact between conductive layer 238 and bumps 174. During the formation of interconnect structure 240, core 178 provides structural stability and maintains a fixed distance between substrate 160 and interconnect structure 240.

Figure 6G:
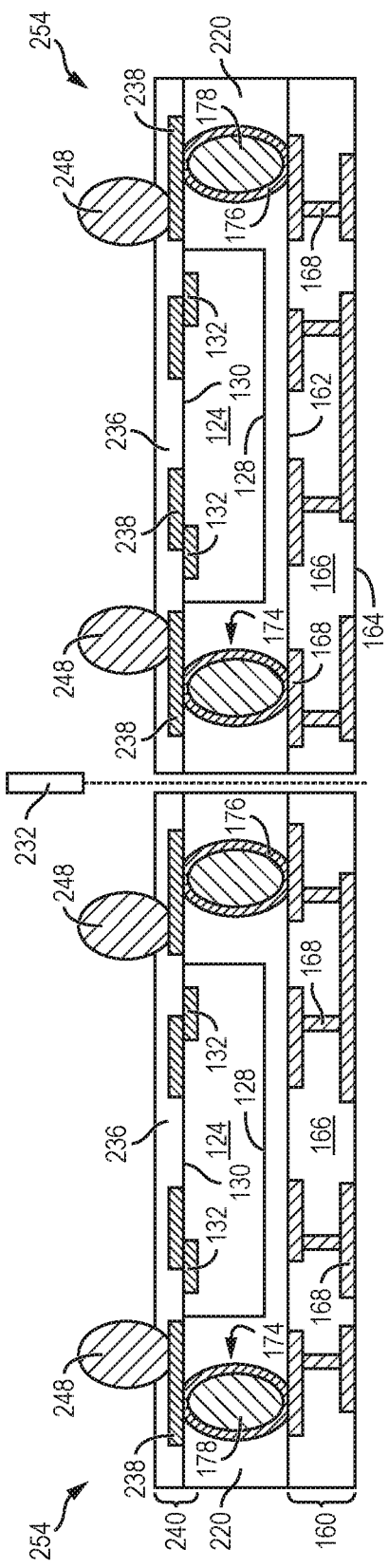

In FIG. 6g, a portion of insulating layer 236 is removed by an exposure or development process, LDA, etching, or other suitable process to form openings in insulating layer 236 and expose portions of conductive layer 238 for subsequent electrical interconnection. Bump material is deposited within the openings in insulating layer 236 over conductive layer 238 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 238 using a suitable attachment or bonding process. In one embodiment, the bump material is reflowed by heating the material above its melting point to form balls or bumps 248. In some applications, bumps 248 are reflowed a second time to improve electrical contact to conductive layer 238. Bumps 248 can also be compression bonded or thermocompression bonded to conductive layer 238. Bumps 248 represent one type of interconnect structure that can be formed over conductive layer 238. The interconnect structure can also use conductive paste, stud bump, micro bump, or other electrical interconnect.

FIG. 6g further shows reconfigured wafer 228 is singulated using a saw blade or laser cutting tool 232 into individual semiconductor packages 254. Alternatively, application of bumps 248 may occur post-singulation.

Figure 6H:
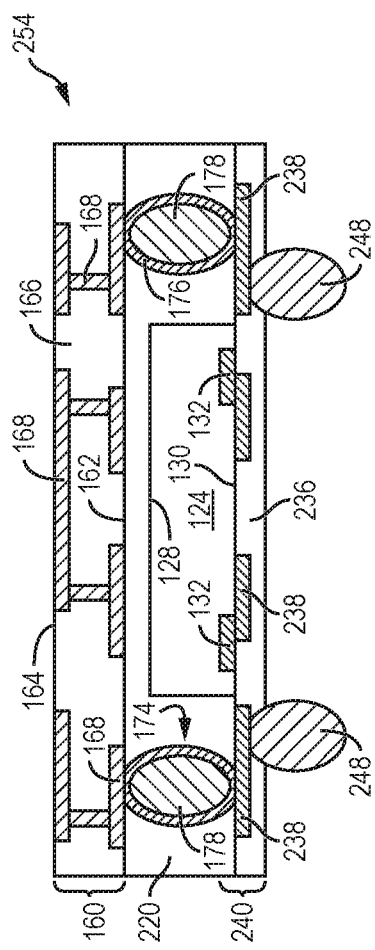

FIG. 6h shows a semiconductor package 254 after singulation from reconfigured wafer 228 with semiconductor die 124 embedded within insulating film 220 and build up interconnect structure 240 formed over active surface 130 of semiconductor die 124. Interconnect structure 240 includes a combination of insulating layer 236, conductive layer 238, and bumps 248. Interconnect structure 240 over insulating film 220 provides high density wiring patterns to achieve significant performance improvements. Interconnect structure 240 has a minimized thickness and reduces process steps because conductive layer 238 can be formed directly on the accessible portion of outer layer 176 of bumps 174 without having to etch or drill through insulating film 220. Interconnect structure 240 has improved reliability and is efficient for 3D integration and vertical stacking over semiconductor die 124. Further, interconnect structure 240 is a low cost addition to semiconductor package 254. In one embodiment, semiconductor package 254 is a 3D dual side die-embedded build-up eWLB PoP.

Bumps 174 embedded within insulating film 220 provide vertical electrical interconnect between substrate 160 and interconnect structure 240. Bumps 174 reduce process steps because semiconductor package 254 does not require laser drilling and via filling to establish electrical interconnection between substrate 160 and interconnect structure 240. Substrate 160 further reduces process steps because substrate 160 can provide routing and electrical redistribution for semiconductor package 254 over back surface 128 of semiconductor die opposite interconnect structure 240 without the additional process steps required to form an RDL over back surface 128.

Semiconductor package 254, with prefabricated insulating film 220 and substrate 160, reduces the need to employ grinding processes to expose conductive layers or form planar surfaces. Issues arising from controlling the volume of encapsulation materials, molding compound, or conventional insulating materials are mitigated because insulating film 220 is a prefabricated film layer and can be pre-tailored to meet the specifications of the semiconductor package 254. Semiconductor package 254, with interconnect structure 240 and substrate 160 over opposing sides of semiconductor package 254, is suitable for stacking with additional semiconductor components.

Insulating film 220 embeds and supports semiconductor die 124 with reduced process steps. Insulating film 220, as a prefabricated component laminated over semiconductor die 124, does not require being formed or built up over the semiconductor die 124. Insulating film 220 reduces process steps because insulating film 220 and other prefabricated layers similar to insulating film 220 can be processed and applied continuously over semiconductor die 124. Insulating film 220 is not susceptible to complications arising from the application of conventional insulating materials. For example, as a prefabricated structure, insulating film 220 reduces the formation of voids, roughness, and imperfections generated by conventional liquid coating processes. Insulating film 220 reduces the likelihood of warpage in a semiconductor package. Insulating film 220 improves environmental conditions by, e.g., reducing solvent evaporation and the creation of wasteful byproducts typically generated with liquid insulating materials. Insulating film 220 has a reduced CTE, and high insulation reliability. Insulating film 220 reduces shifting of semiconductor die 124 during the formation of interconnect structure 240. Insulating film 220 has advanced adhesive properties and smooth surfaces which facilitates the formation of interconnect structure 240 and improves the electrical conductivity of conductive layer 238. Insulating film 220 can be reinforced with glass fibers, glass fillers, or glass cloth, to form a robust and secure embedding material for semiconductor die 124 and provide enhanced structural stability across the thickness of semiconductor package 254.

FIGS. 7a-7d illustrate another process of disposing an insulating film over a substrate with bumps and embedding a plurality of semiconductor die within the insulating film to form a semiconductor package similar to the process illustrated in FIGS. 5a-5g. FIG. 7a, continuing from FIG. 5c, shows the combination of substrate 160, bumps 174, insulating film 180, and reconstituted wafer 156, with insulating film 180 covering side surfaces and back surface 128 of semiconductor die 124 to secure semiconductor die 124 and form reconfigured wafer 188. Bumps 174 extend from substrate 160 through insulating film 180 and semiconductor die are disposed adjacent to and between bumps 174. Carrier 150 from FIG. 5c is removed by chemical etching, mechanical peeling, chemical mechanical planarization (CMP), mechanical grinding, thermal bake, UV light, laser scanning, or wet stripping to expose active surface 130 of semiconductor die 124 and insulating film 180.

In FIG. 7a, a portion of insulating film 180, outer layer 176, and core 178 is removed by an etching process or laser direct ablation (LDA) using laser cutting tool 192 to form vias or openings 190 and expose core 178 of bumps 174. In some embodiments, exposing bumps 174 further includes a solder deflash process. In some embodiments, vias 190 are formed using mask-based exposure, a stepper, and a large field exposure system. Alternatively, no portion of core 178 is removed and instead vias 190 remove a portion of insulating film 180 and expose outer layer 176.

In FIG. 7b, build-up interconnect structure 200 is formed over active surface 130 of semiconductor die 124, bumps 174, and insulating film 180. Build-up interconnect structure 200 comprises insulating layer 196 and conductive layer 198.

Insulating or passivation layer 196 is formed over active surface 130 and insulating film 180 using PVD, CVD, printing, lamination, spin coating, spray coating, sintering, or thermal oxidation. Insulating layer 196 contains one or more layers of SiO2, Si3N4, SiON, Ta2O5, Al2O3, or other material having similar insulating and structural properties. The smooth surfaces of insulating film 180 facilitate an interface between insulating layer 196 and insulating film 180 with reduced imperfections along the interface. Alternatively, insulating layer 196 is a laminated insulating, passivation, dielectric, or epoxy layer, similar to insulating film 180. Insulating layer 196 may further comprise one or more resist layers. A portion of insulating layer 196 is removed by an etching process or LDA to expose vias 190 and contact pads 132 over active surface 130.

Conductive layer 198 comprises one or more conductive layers formed over insulating film 180 and within insulating layer 196 using PVD, CVD, electrolytic plating, electroless plating process, or other suitable metal deposition process. Conductive layer 198 can be one or more layers of Al, Cu, Sn, Ni, Au, Ag, or other suitable electrically conductive material. The smooth surfaces of insulating film 180 facilitate an interface between conductive layer 198 and insulating film 180 with reduced imperfections along the interface which improves the electrical characteristics of conductive layer 198. One portion of conductive layer 198 is electrically connected to contact pads 132 of semiconductor die 124. Other portions of conductive layer 198 are disposed within vias 190 and electrically connected to bumps 174. In the case where core 178 is exposed, portions of conductive layer 198 directly contact core 178. Alternatively, where a portion of outer layer 176 remains between conductive layer 198 and core 178, outer layer 176 is reflowed to improve electrical contact to conductive layer 198 and conductive layer 198 does not make direct contact with core 178. Other portions of conductive layer 198 can be electrically common or electrically isolated depending on the design and function of semiconductor die 124. In some embodiments, conductive layer 198 provides electrical redistribution between semiconductor die 124 and bumps 174 and to other areas according to the specifications of the semiconductor package. During the formation of interconnect structure 200, core 178 provides structural stability and maintains a fixed distance between substrate 160 and interconnect structure 200.

In FIG. 7c, a portion of insulating layer 196 is removed by an exposure or development process, LDA, etching, or other suitable process to form openings in insulating layer 196 and expose portions of conductive layer 198 for subsequent electrical interconnection. Bump material is deposited within the openings in insulating layer 196 over conductive layer 198 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 198 using a suitable attachment or bonding process. In one embodiment, the bump material is reflowed by heating the material above its melting point to form balls or bumps 208. In some applications, bumps 208 are reflowed a second time to improve electrical contact to conductive layer 198. Bumps 208 can also be compression bonded or thermocompression bonded to conductive layer 198. Bumps 208 represent one type of interconnect structure that can be formed over conductive layer 198. The interconnect structure can also use conductive paste, stud bump, micro bump, or other electrical interconnect.

FIG. 7c further shows reconfigured wafer 188 is singulated using a saw blade or laser cutting tool 192 into individual semiconductor packages 255. Alternatively, application of bumps 208 may occur post-singulation.

FIG. 7d shows a semiconductor package 255 after singulation from reconstituted wafer 188 with semiconductor die 124 embedded within insulating film 180 and build up interconnect structure 200 formed over active surface 130 of semiconductor die 124. Interconnect structure 200 includes a combination of insulating layer 196, conductive layer 198, and bumps 208. Interconnect structure 200 over insulating film 180 provides high density wiring patterns to achieve significant performance improvements. Interconnect structure 200 has improved reliability and is efficient for 3D integration and vertical stacking over semiconductor die 124. Further, interconnect structure 200 is a low cost addition to semiconductor package 255. In one embodiment, semiconductor package 255 is a 3D dual side die-embedded build-up eWLB package-on-package (PoP).

Bumps 174 embedded within insulating film 180 provide vertical electrical interconnect between substrate 160 and interconnect structure 200. Bumps 174 reduce process steps because semiconductor package 255 does not require laser drilling and via filling to establish electrical interconnection between substrate 160 and interconnect structure 200. Bumps 174 further provide enhanced structural support because core 178 maintains a fixed distance between interconnect structure 200 and substrate 160. Substrate 160 further reduces process steps because substrate 160 can provide routing and electrical redistribution for semiconductor package 255 over back surface 128 of semiconductor die opposite interconnect structure 200 without the additional process steps required to form an RDL over back surface 128.

Semiconductor package 255, with prefabricated insulating film 180 and substrate 160, reduces the need to apply grinding processes to expose conductive layers or form planar surfaces. Issues arising from controlling the volume of encapsulation materials, molding compound, or conventional insulating materials are mitigated because insulating film 180 is a prefabricated film layer and can be pre-tailored to meet the specifications of the semiconductor package 255.

Semiconductor package 255, with interconnect structure 200 and substrate 160 over opposing sides of semiconductor package 255, is suitable for stacking with additional semiconductor components.

Insulating film 180 embeds and supports semiconductor die 124 with reduced process steps. Insulating film 180, as a prefabricated component laminated over semiconductor die 124, does not require being formed or built up over the semiconductor die 124. Insulating film 180 reduces process steps because insulating film 180 and other prefabricated layers similar to insulating film 180 can be processed and applied continuously over semiconductor die 124. Insulating film 180 is not susceptible to complications arising from the application of conventional insulating materials. For example, as a prefabricated structure, insulating film 180 reduces the formation of voids, roughness, and imperfections generated by conventional liquid coating processes. Insulating film 180 reduces the likelihood of warpage in a semiconductor package. Insulating film 180 improves environmental conditions by, e.g., reducing solvent evaporation and the creation of wasteful byproducts typically generated with liquid insulating materials. Insulating film 180 has a reduced CTE, and high insulation reliability. Insulating film 180 reduces shifting of semiconductor die 124 during the formation of interconnect structure 200. Insulating film 180 has advanced adhesive properties and smooth surfaces which facilitates the formation of interconnect structure 200 and improves the electrical conductivity of conductive layer 198. Insulating film 180 can be reinforced with glass fibers, glass fillers, or glass cloth, to form a robust and secure embedding material for semiconductor die 124 and provide enhanced structural stability across the thickness of semiconductor package 255.

FIGS. 8a-8d illustrate another process of disposing an insulating film over a plurality of semiconductor die to embed the semiconductor die and mounting a substrate with bumps over the semiconductor die to form a semiconductor package similar to the process illustrated in FIGS. 6a-6h. FIG. 8a, continuing from FIG. 6d, shows the combination of substrate 160, bumps 174, insulating film 220, and reconstituted wafer 156, with insulating film 220 covering side surfaces and back surface 128 of semiconductor die 124 to secure semiconductor die 124 and form reconfigured wafer 228. Bumps 174 extend from substrate 160 through insulating film 220 and semiconductor die are disposed adjacent to and between bumps 174. Carrier 150 from FIG. 6d is removed by chemical etching, mechanical peeling, CMP, mechanical grinding, thermal bake, UV light, laser scanning, or wet stripping to expose active surface 130 of semiconductor die 124 and insulating film 220.

In FIG. 8a, a portion of insulating film 220, outer layer 176, and core 178 is removed by an etching process or LDA using laser cutting tool 232 to form vias or openings 230 and expose core 178 of bumps 174. In some embodiments, exposing bumps 174 further includes a solder deflash process. In some embodiments, vias 230 are formed using mask-based exposure, a stepper, and a large field exposure system. Alternatively, no portion of core 178 is removed and instead vias 230 remove a portion of insulating film 220 and expose outer layer 176.

In FIG. 8b, a build-up interconnect structure 240 is formed over active surface 130 of semiconductor die 124, bumps 174, and insulating film 220. Build-up interconnect structure 240 comprises insulating layer 236 and conductive layer 238.

Insulating or passivation layer 236 is formed over active surface 130 and insulating film 220 using PVD, CVD, printing, lamination, spin coating, spray coating, sintering, or thermal oxidation. Insulating layer 236 contains one or more layers of SiO2, Si3N4, SiON, Ta2O5, Al2O3, or other material having similar insulating and structural properties. The smooth surfaces of insulating film 220 facilitate an interface between insulating layer 236 and insulating film 220 with reduced imperfections along the interface. Alternatively, insulating layer 236 is a laminated insulating, passivation, dielectric, or epoxy layer, similar to insulating film 220. Insulating layer 236 may further comprise one or more resist layers. A portion of insulating layer 236 is removed by an etching process or LDA to expose vias 230 and contact pads 132 over active surface 130.

Conductive layer 238 comprises one or more conductive layers formed over insulating film 220 and within insulating layer 236 using PVD, CVD, electrolytic plating, electroless plating process, or other suitable metal deposition process. Conductive layer 238 can be one or more layers of Al, Cu, Sn, Ni, Au, Ag, or other suitable electrically conductive material. The smooth surfaces of insulating film 220 facilitate an interface between conductive layer 238 and insulating film 220 with reduced imperfections along the interface which improves the electrical characteristics of conductive layer 238. One portion of conductive layer 238 is electrically connected to contact pads 132 of semiconductor die 124. Other portions of conductive layer 238 are disposed within vias 230 and electrically connected to bumps 174. In the case where core 178 is exposed, portions of conductive layer 238 directly contact core 178. Alternatively, where a portion of outer layer 176 remains between conductive layer 238 and core 178, outer layer 176 can be reflowed to improve electrical contact to conductive layer 238 and conductive layer 238 does not make direct contact with core 178. Other portions of conductive layer 238 can be electrically common or electrically isolated depending on the design and function of semiconductor die 124. In some embodiments, conductive layer 238 provides electrical redistribution between semiconductor die 124 and bumps 174 and to other areas according to the specifications of the semiconductor package. During the formation of interconnect structure 240, core 178 provides structural stability and maintains a fixed distance between substrate 160 and interconnect structure 240.

In FIG. 8c, a portion of insulating layer 236 is removed by an exposure or development process, LDA, etching, or other suitable process to form openings in insulating layer 236 and expose portions of conductive layer 238 for subsequent electrical interconnection. Bump material is deposited within the openings in insulating layer 236 over conductive layer 238 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 238 using a suitable attachment or bonding process. In one embodiment, the bump material is reflowed by heating the material above its melting point to form balls or bumps 248. In some applications, bumps 248 are reflowed a second time to improve electrical contact to conductive layer 238. Bumps 248 can also be compression bonded or thermocompression bonded to conductive layer 238. Bumps 248 represent one type of interconnect structure that can be formed over conductive layer 238. The interconnect structure can also use conductive paste, stud bump, micro bump, or other electrical interconnect.

FIG. 8c further shows reconfigured wafer 228 is singulated using a saw blade or laser cutting tool 232 into individual semiconductor packages 256. Alternatively, application of bumps 248 may occur post-singulation.

FIG. 8d shows a semiconductor package 256 after singulation from reconfigured wafer 228 with semiconductor die 124 embedded within insulating film 220 and build up interconnect structure 240 formed over active surface 130 of semiconductor die 124. Interconnect structure 240 includes a combination of insulating layer 236, conductive layer 238, and bumps 248. Interconnect structure 240 over insulating film 220 provides high density wiring patterns to achieve significant performance improvements. Interconnect structure 240 has improved reliability and is efficient for 3D integration and vertical stacking over semiconductor die 124. Further, interconnect structure 240 is a low cost addition to semiconductor package 256. In one embodiment, semiconductor package 256 is a 3D dual side die-embedded build-up eWLB PoP.

Bumps 174 embedded within insulating film 220 provide vertical electrical interconnect between substrate 160 and interconnect structure 240. Bumps 174 reduce process steps because semiconductor package 256 does not require laser drilling and via filling to establish electrical interconnection between substrate 160 and interconnect structure 240. Substrate 160 further reduces process steps because substrate 160 can provide routing and electrical redistribution for semiconductor package 256 over back surface 128 of semiconductor die opposite interconnect structure 240 without the additional process steps required to form an RDL over back surface 128.

Semiconductor package 256, with prefabricated insulating film 220 and substrate 160, reduces the need to employ grinding processes to expose conductive layers or form planar surfaces. Issues arising from controlling the volume of encapsulation materials, molding compound, or conventional insulating materials are mitigated because insulating film 220 is a prefabricated film layer and can be pre-tailored to meet the specifications of the semiconductor package 256. Semiconductor package 256, with interconnect structure 240 and substrate 160 over opposing sides of semiconductor package 256, is suitable for stacking with additional semiconductor components.

Insulating film 220 embeds and supports semiconductor die 124 with reduced process steps. Insulating film 220, as a prefabricated component laminated over semiconductor die 124, does not require being formed or built up over the semiconductor die 124. Insulating film 220 reduces process steps because insulating film 220 and other prefabricated layers similar to insulating film 220 can be processed and applied continuously over semiconductor die 124. Insulating film 220 is not susceptible to complications arising from the application of conventional insulating materials. For example, as a prefabricated structure, insulating film 220 reduces the formation of voids, roughness, and imperfections generated by conventional liquid coating processes. Insulating film 220 reduces the likelihood of warpage in a semiconductor package. Insulating film 220 improves environmental conditions by, e.g., reducing solvent evaporation and the creation of wasteful byproducts typically generated with liquid insulating materials. Insulating film 220 has a reduced CTE, and high insulation reliability. Insulating film 220 reduces shifting of semiconductor die 124 during the formation of interconnect structure 240. Insulating film 220 has advanced adhesive properties and smooth surfaces which facilitates the formation of interconnect structure 240 and improves the electrical conductivity of conductive layer 238. Insulating film 220 can be reinforced with glass fibers, glass fillers, or glass cloth, to form a robust and secure embedding material for semiconductor die 124 and provide enhanced structural stability across the thickness of semiconductor package 256.

Figure 9:
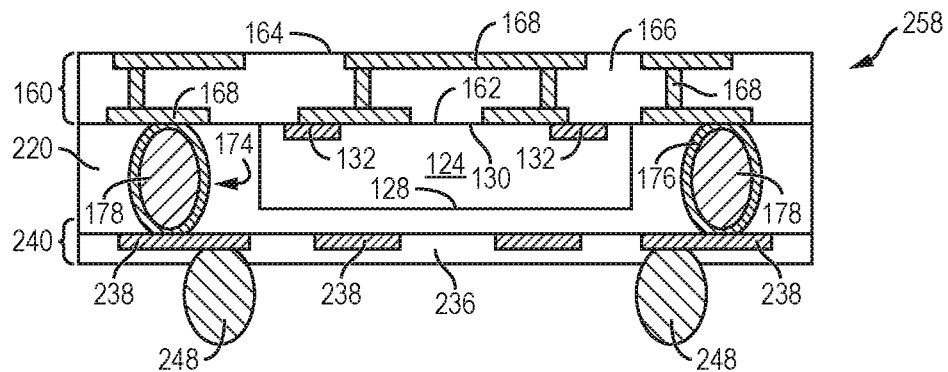
FIG. 9 illustrates a semiconductor package with the active surface of the semiconductor die oriented towards the substrate.

FIG. 9 illustrates a semiconductor package, similar to semiconductor package 254 and formed by a process similar to the process illustrated in FIGS. 6a-6h. Active surface 130 of semiconductor die 124 is oriented towards substrate 160 to form semiconductor package 258. Active surface 130 is electrically connected to conductive layers 168 of substrate 160. In one embodiment, semiconductor package 258 is a 3D dual side die-embedded build-up eWLB PoP.

In one embodiment, semiconductor package 258, with active surface 130 of semiconductor die 124 oriented towards substrate 160, can be achieved by modifying the process of FIGS. 3a-3b to have back surface 128 of semiconductor die 124 mounted to carrier 150 instead of active surface 130 resulting in a modified version of reconstituted wafer 156 with active surface 130 oriented away from carrier 150. As such, active surface 130 is accessible for mounting to substrate 160 to achieve the structure shown in FIG. 7. Alternatively, to form semiconductor package 258, active surface 130 of semiconductor 124 can be mounted to substrate 160 between bumps 174 without using a carrier, e.g., without using carrier 150. Thereafter, insulating film 220 is laminated over substrate 160, bumps 174, and semiconductor die 124, similar to the process shown in FIGS. 6c-6d, followed by the formation of interconnect structure 240 similar to the process shown in FIGS. 6e-6g.

Interconnect structure 240 includes a combination of insulating layer 236, conductive layer 238, and bumps 248. Interconnect structure 240 over insulating film 220 provides high density wiring patterns to achieve significant performance improvements. Interconnect structure 240 has improved reliability and is efficient for 3D integration and vertical stacking over semiconductor die 124. Further, interconnect structure 240 is a low cost addition to semiconductor package 258.

Bumps 174 embedded within insulating film 220 provide vertical electrical interconnect between substrate 160 and interconnect structure 240. Bumps 174 reduce process steps because semiconductor package 258 does not require laser drilling and via filling to establish electrical interconnection between substrate 160 and interconnect structure 240. Substrate 160 further reduces process steps because substrate 160 can provide routing and electrical redistribution for semiconductor die 124 within semiconductor package 258 while reducing the number of RDLs formed in the package.

Semiconductor package 258, with prefabricated insulating film 220 and substrate 160, reduces the need to employ grinding processes to expose conductive layers or form planar surfaces. Issues arising from controlling the volume of encapsulation materials, molding compound, or conventional insulating materials are mitigated because insulating film 220 is a prefabricated film layer and can be pre-tailored to meet the specifications of the semiconductor package 258.

Semiconductor package 258, with interconnect structure 240 and substrate 160 over opposing sides of semiconductor package 258, is suitable for stacking with additional semiconductor components.

Insulating film 220 embeds and supports semiconductor die 124 with reduced process steps. Insulating film 220, as a prefabricated component laminated over semiconductor die 124, does not require being formed or built up over the semiconductor die 124. Insulating film 220 reduces process steps because insulating film 220 and other prefabricated layers similar to insulating film 220 can be processed and applied continuously over semiconductor die 124. Insulating film 220 is not susceptible to complications arising from the application of conventional insulating materials. For example, as a prefabricated structure, insulating film 220 reduces the formation of voids, roughness, and imperfections generated by conventional liquid coating processes. Insulating film 220 reduces the likelihood of warpage in a semiconductor package. Insulating film 220 improves environmental conditions by, e.g., reducing solvent evaporation and the creation of wasteful byproducts typically generated with liquid insulating materials. Insulating film 220 has a reduced CTE, and high insulation reliability. Insulating film 220 reduces shifting of semiconductor die 124 during the formation of interconnect structure 240. Insulating film 220 has advanced adhesive properties and smooth surfaces which facilitates the formation of interconnect structure 240 and improves the electrical conductivity of conductive layer 238. Insulating film 220 can be reinforced with glass fibers, glass fillers, or glass cloth, to form a robust and secure embedding material for semiconductor die 124 and provide enhanced structural stability across the thickness of semiconductor package 258.

Figure 10:
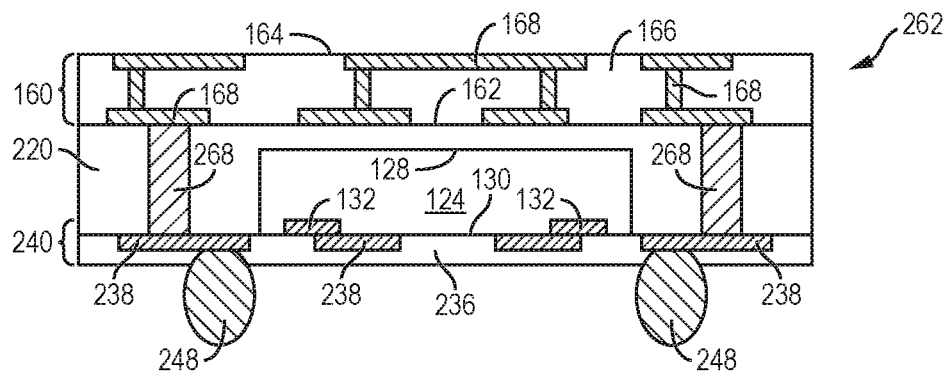
FIG. 10 illustrates a semiconductor package having a substrate prefabricated with conductive bodies extending from the substrate to provide 3D vertical interconnect through an insulating film.

FIG. 10 illustrates a semiconductor package, formed by a process similar to FIGS. 6a-6h, with a substrate prefabricated with conductive bodies extending from the substrate to provide 3D vertical interconnect through an insulating film and form semiconductor package 262. In one embodiment, semiconductor package 262 is a 3D dual side die-embedded build-up eWLB PoP.

FIG. 10 shows substrate 160, similar to the substrate 160 described in FIG. 4a containing insulating material 166 and conductive layers 168 with surface 162 of substrate 160 and surface 164 opposite surface 162. Multiple rows of conductive posts, bodies, or leads 268 extend from substrate 160 and are electrically connected to conductive layer 168. In one embodiment, substrate 160 is prefabricated with conductive posts 268 extending from substrate 160. By nature of extending from substrate 160, conductive posts 268 have a fixed spacing between posts. Conductive posts 268 can be rectangular, circular, hexagonal, or other geometric shape. Conductive posts 268 can also have a tapered shape. In one embodiment, insulating film 220 is laminated over substrate 160 to embed conductive posts 268 similar to the process shown in FIG. 5a. Conductive posts 268 are electrically connected to portions of conductive layer 238 of interconnect structure 240 such that conductive posts 268 provide vertical or z-direction electrical interconnection between substrate 160 and interconnect structure 240. Although not shown, substrate 160 may further include bumps 174 from FIG. 6h in addition to conductive posts 268. Bumps 174 may be disposed adjacent to conductive posts 268.

Conductive posts 268 are disposed and embedded within insulating film 220 to provide z-direction electrical interconnect between substrate 160 and interconnect structure 240. Substrate 160, prefabricated with conductive posts 268, reduces manufacturing steps because conductive posts 268 of substrate 160 provide vertical interconnection within semiconductor package 262 while reducing the steps typically required to form vertical interconnect structures over substrate 160. Insulating film 220 can be easily and efficiently applied over substrate 160 and conductive posts 268. Substrate 160 can be prefabricated with an orientation of conductive posts 268 that is predetermined to meet the needs of semiconductor package 262.

Interconnect structure 240 includes a combination of insulating layer 236, conductive layer 238, and bumps 248. Interconnect structure 240 over insulating film 220 provides high density wiring patterns to achieve significant performance improvements. Interconnect structure 240 has improved reliability and is efficient for 3D integration and vertical stacking over semiconductor die 124. Further, interconnect structure 240 is a low cost addition to semiconductor package 262.

Substrate 160 with conductive posts 268 reduces process steps because substrate 160 can provide vertical and horizontal routing and electrical redistribution within semiconductor package 262 and reduce the number of RDLs formed in the package. Semiconductor package 262, with prefabricated insulating film 220, substrate 160, and conductive posts 268, reduces the need to apply grinding processes to expose conductive layers or form planar surfaces. Issues arising from controlling the volume of encapsulation materials, molding compound, or conventional insulating materials are mitigated because insulating film 220 is a prefabricated film layer and can be pre-tailored to meet the specifications of the semiconductor package 262. Semiconductor package 262, with interconnect structure 240 and substrate 160 over opposing sides of semiconductor package 262, is suitable for stacking with additional semiconductor components.

Insulating film 220 embeds and supports semiconductor die 124 with reduced process steps. Insulating film 220, as a prefabricated component laminated over semiconductor die 124, does not require being formed or built up over the semiconductor die 124. Insulating film 220 reduces process steps because insulating film 220 and other prefabricated layers similar to insulating film 220 can be processed and applied continuously over semiconductor die 124. Insulating film 220 is not susceptible to complications arising from the application of conventional insulating materials. For example, as a prefabricated structure, insulating film 220 reduces the formation of voids, roughness, and imperfections generated by conventional liquid coating processes. Insulating film 220 reduces the likelihood of warpage in a semiconductor package. Insulating film 220 improves environmental conditions by, e.g., reducing solvent evaporation and the creation of wasteful byproducts typically generated with liquid insulating materials. Insulating film 220 has a reduced CTE, and high insulation reliability. Insulating film 220 reduces shifting of semiconductor die 124 during the formation of interconnect structure 240. Insulating film 220 has advanced adhesive properties and smooth surfaces which facilitates the formation of interconnect structure 240 and improves the electrical conductivity of conductive layer 238. Insulating film 220 can be reinforced with glass fibers, glass fillers, or glass cloth, to form a robust and secure embedding material for semiconductor die 124 and provide enhanced structural stability across the thickness of semiconductor package 262.

Figure 11:
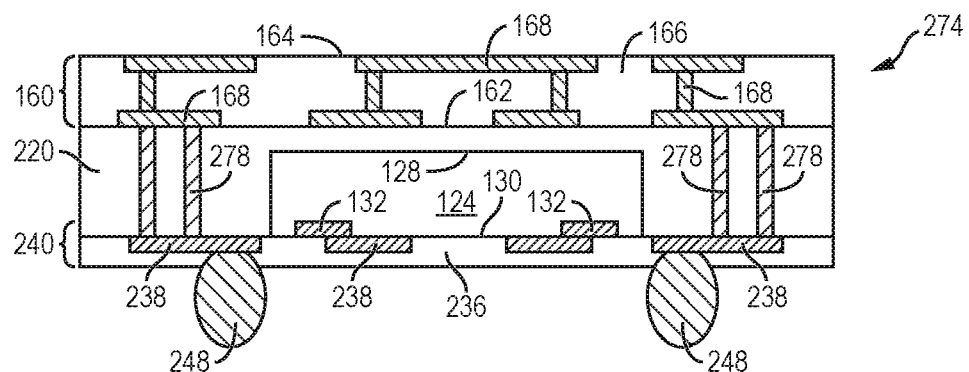
FIG. 11 illustrates a semiconductor package with discrete passive devices mounted to the substrate.

FIG. 11 illustrates a semiconductor package, formed by a process similar to FIGS. 6a-6h, with discrete passive devices mounted to a substrate to form semiconductor package 274. In one embodiment, semiconductor package 274 is a 3D dual side die-embedded build-up eWLB PoP. FIG. 9 shows substrate 160, similar to the substrate 160 described in FIG. 4a containing insulating material 166 and conductive layers 168 with surface 162 of substrate 160 and surface 164 opposite surface 162. A plurality of discrete devices 278 is disposed between substrate 160 and interconnect structure 240. Discrete devices 278 may include an IPD, such as a capacitor, inductor, or resistor. Discrete devices may be mounted over surface 162 of substrate 160 using an adhesive similar to the process shown for mounting bumps 174 over substrate 160 in FIGS. 4a-4b. In one embodiment, discrete devices 278 are electrically connected to conductive layer 168 of substrate 160. Discrete devices 278 are electrically connected to portions of conductive layer 238 of interconnect structure 240 such that discrete devices 278 provide electrical interconnection between substrate 160 and interconnect structure 240.

In one embodiment, insulating film 220 is laminated over substrate 160 to embed discrete devices 278 similar to the process shown in FIG. 5a. Although not shown, substrate 160 may further include bumps 174 from FIG. 6h in addition to discrete devices 278. Bumps 174 may be disposed adjacent to discrete devices 278.

Discrete devices 278 are disposed and embedded within insulating film 220. Discrete devices 278 provide specific electrical functions in addition to z-direction electrical interconnect between substrate 160 and interconnect structure 240. Insulating film 220 can be easily and efficiently applied over substrate 160 and discrete devices 278.

Interconnect structure 240 includes a combination of insulating layer 236, conductive layer 238, and bumps 248. Interconnect structure 240 over insulating film 220 provides high density wiring patterns to achieve significant performance improvements. Interconnect structure 240 has improved reliability and is efficient for 3D integration and vertical stacking over semiconductor die 124. Further, interconnect structure 240 is a low cost addition to semiconductor package 274.

Substrate 160 with discrete devices 278 reduces process steps because substrate 160 can provide vertical and horizontal routing and electrical redistribution within semiconductor package 274 and reduce the number of RDLs formed in the package. Semiconductor package 274, with prefabricated insulating film 220 and substrate 160, reduces the need to apply grinding processes to expose conductive layers or form planar surfaces. Issues arising from controlling the volume of encapsulation materials, molding compound, or conventional insulating materials are mitigated because insulating film 220 is a prefabricated film layer and can be pre-tailored to meet the specifications of the semiconductor package 274. Semiconductor package 274, with interconnect structure 240 and substrate 160 over opposing sides of semiconductor package 274, is suitable for stacking with additional semiconductor components.

Insulating film 220 embeds and supports semiconductor die 124 with reduced process steps. Insulating film 220, as a prefabricated component laminated over semiconductor die 124, does not require being formed or built up over the semiconductor die 124. Insulating film 220 reduces process steps because insulating film 220 and other prefabricated layers similar to insulating film 220 can be processed and applied continuously over semiconductor die 124. Insulating film 220 is not susceptible to complications arising from the application of conventional insulating materials. For example, as a prefabricated structure, insulating film 220 reduces the formation of voids, roughness, and imperfections generated by conventional liquid coating processes.

Insulating film 220 reduces the likelihood of warpage in a semiconductor package. Insulating film 220 improves environmental conditions by, e.g., reducing solvent evaporation and the creation of wasteful byproducts typically generated with liquid insulating materials. Insulating film 220 has a reduced CTE, and high insulation reliability. Insulating film 220 reduces shifting of semiconductor die 124 during the formation of interconnect structure 240. Insulating film 220 has advanced adhesive properties and smooth surfaces which facilitates the formation of interconnect structure 240 and improves the electrical conductivity of conductive layer 238. Insulating film 220 can be reinforced with glass fibers, glass fillers, or glass cloth, to form a robust and secure embedding material for semiconductor die 124 and provide enhanced structural stability across the thickness of semiconductor package 274.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   disposing the semiconductor die over a carrier;
   disposing a substrate over the carrier;
   laminating a prefabricated insulating film onto the substrate; and
   mounting the substrate to the carrier with the semiconductor die embedded in the prefabricated insulating film after laminating the insulating film onto the substrate.

2. The method of claim 1, further including disposing a plurality of bumps on the substrate prior to laminating the insulating film onto the substrate.

3. The method of claim 1, further including removing the carrier after mounting the substrate to the carrier.

4. The method of claim 3, further including forming a build-up interconnect structure over the prefabricated insulating film opposite the substrate after removing the carrier.

5. A method of making a semiconductor device, comprising:
   providing a semiconductor die;
   providing a substrate;
   laminating a prefabricated insulating film over the substrate;
   disposing the substrate and prefabricated insulating film over the semiconductor die; and
   applying pressure to the substrate to embed the semiconductor die in the prefabricated insulating film after laminating the prefabricated insulating film over the substrate.

6. The method of claim 5, wherein the substrate includes a conductive layer that remains exposed after the applying pressure step.

7. The method of claim 5, further including:
   disposing the semiconductor die on a carrier; and
   removing the carrier after the applying pressure step.

8. The method of claim 7, further including forming an interconnect structure over the prefabricated insulating film opposite the substrate after removing the carrier.

9. The method of claim 5, further including:
   providing an interconnect structure on the substrate; and
   laminating the prefabricated insulating film over the substrate with the interconnect structure embedded in the prefabricated insulating film.

10. The method of claim 9, wherein the interconnect structure extends completely through the prefabricated insulating film.

11. A method of making a semiconductor device, comprising:
    providing a semiconductor die;
    providing a substrate; and
    disposing the substrate over the semiconductor die with the semiconductor die embedded in a prefabricated insulating film.

12. The method of claim 11, further including forming a build-up interconnect structure over the prefabricated insulating film and an active surface of the semiconductor die.

13. The method of claim 12, further including providing a conductive bump that extends from the substrate to the build-up interconnect structure through the prefabricated insulating film.

14. The method of claim 13, wherein the conductive bump includes copper.

15. The method of claim 11, wherein the substrate includes a conductive layer exposed opposite the prefabricated insulating film.

16. A semiconductor device, comprising:
    a semiconductor die;
    a substrate; and
    a prefabricated insulating film disposed between the substrate and a non-active surface of the semiconductor die, wherein the semiconductor die is embedded in the prefabricated insulating film.

17. The semiconductor device of claim 16, further including a build-up interconnect structure formed over the prefabricated insulating film and an active surface of the semiconductor die.

18. The semiconductor device of claim 17, further including a conductive bump formed over the build-up interconnect structure opposite the prefabricated insulating film.

19. The semiconductor device of claim 17, further including a conductive bump extending from the substrate to the build-up interconnect structure through the prefabricated insulating film.

20. The semiconductor device of claim 19, wherein the conductive bump includes copper.

21. The semiconductor device of claim 16, wherein the substrate includes a conductive layer exposed opposite the prefabricated insulating film.

22. The method of claim 2, wherein each of the bumps includes a copper core and a solder coating disposed around the copper core.

23. The method of claim 22, further including removing a portion of the solder coating to expose the copper core after mounting the substrate to the carrier.

24. The method of claim 5, wherein the interconnect structure includes a copper core and a solder coating disposed around the copper core.

25. The method of claim 24, further including removing a portion of the solder coating to expose the copper core.

* * * * *